United States Patent
Chen et al.

(10) Patent No.: US 12,048,142 B2
(45) Date of Patent: Jul. 23, 2024

(54) METHODS FOR MANUFACTURING A PLURALITY OF SEMICONDUCTOR STRUCTURES AND SYSTEM IN PACKAGE

(71) Applicant: AP MEMORY TECHNOLOGY CORPORATION, Hsinchu County (TW)

(72) Inventors: Wenliang Chen, Hsinchu County (TW); Lin Ma, Hsinchu County (TW)

(73) Assignee: AP MEMORY TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 18/307,607

(22) Filed: Apr. 26, 2023

(65) Prior Publication Data

US 2023/0262957 A1    Aug. 17, 2023

Related U.S. Application Data

(63) Continuation of application No. 16/920,427, filed on Jul. 3, 2020, now Pat. No. 11,672,111, which is a
(Continued)

(51) Int. Cl.
*H01L 23/495* (2006.01)
*H01L 23/00* (2006.01)
(Continued)

(52) U.S. Cl.
CPC ....... *H10B 12/30* (2023.02); *H01L 23/49513* (2013.01); *H01L 23/5226* (2013.01);
(Continued)

(58) Field of Classification Search
CPC ..... H01L 23/00; H01L 23/495; H01L 23/522; H01L 23/49513; H01L 23/5226;
(Continued)

(56) References Cited

U.S. PATENT DOCUMENTS

2020/0075537 A1 *  3/2020  Luo ................. H01L 25/0652
2020/0328176 A1   10/2020  Liu
(Continued)

FOREIGN PATENT DOCUMENTS

CN    110249427 A    9/2019
CN    110546762 A    12/2019
(Continued)

OTHER PUBLICATIONS

First Office Action of CN family patent Application No. 202110412031.8, mailed on Sep. 19, 2023.
(Continued)

*Primary Examiner* — Chuong A Luu
(74) *Attorney, Agent, or Firm* — WPAT, P.C.; Anthony King

(57) ABSTRACT

A method for manufacturing a plurality of semiconductor structures is provided. The method includes the operations as follows. A first hybrid bonding layer is formed over a first wafer including a plurality of first memory structures. A second hybrid bonding layer is formed over a second wafer including a plurality of control circuit structures. The memory structures and the control circuit structures are in contact with the first and the second hybrid bonding layers, respectively. The first wafer and the second wafer are bonded through a first hybrid bonding operation to connect the first and the second hybrid bonding layers, thereby obtaining a first bonded wafer. At least the first wafer, the second wafer, the first hybrid bonding structure, and the second hybrid bonding structure are singulated to obtain the plurality of semiconductor structures. A method for manufacturing a system in package (SiP) is also provided.

19 Claims, 23 Drawing Sheets

Related U.S. Application Data continuation-in-part of application No. 16/232,417, filed on Dec. 26, 2018, now Pat. No. 10,811,402.

(60) Provisional application No. 63/021,608, filed on May 7, 2020.

(51) Int. Cl.
 *H01L 23/522* (2006.01)
 *H10B 12/00* (2023.01)

(52) U.S. Cl.
 CPC .............. *H01L 24/06* (2013.01); *H01L 24/09* (2013.01); *H01L 24/17* (2013.01); *H10B 12/01* (2023.02)

(58) Field of Classification Search
 CPC ....... H01L 25/00; H01L 25/50; H01L 25/065; H01L 25/0652; H01L 25/0657; H01L 24/06; H01L 24/08; H01L 24/09; H01L 24/17; H01L 24/80; H01L 2224/02372; H01L 2224/05024; H01L 2224/05548; H01L 2224/05568; H01L 2224/005647; H01L 2224/008145; H01L 2224/09181; H01L 2224/09517; H01L 2224/16225; H01L 2224/131; H01L 2224/73251; H01L 2224/80357; H01L 2224/80895; H01L 2224/80896; H01L 2224/80948; H01L 2224/80986; H01L 2224/9202; H01L 2224/06524; H01L 2224/06527; H01L 2224/94; H10B 12/00; H10B 12/01; H10B 12/30

USPC ........................................................ 438/614
See application file for complete search history.

(56) References Cited

U.S. PATENT DOCUMENTS

| | | |
|---|---|---|
| 2020/0350014 A1 | 11/2020 | Liu |
| 2020/0350322 A1 | 11/2020 | Liu et al. |
| 2021/0098409 A1* | 4/2021 | Chen ...................... H01L 21/56 |
| 2021/0134748 A1 | 5/2021 | Liu |

FOREIGN PATENT DOCUMENTS

| | | |
|---|---|---|
| CN | 110945650 A | 3/2020 |
| CN | 110945652 A | 3/2020 |

OTHER PUBLICATIONS

English translation (brief) of the First Office Action of CN family patent Application No. 202110412031.8, mailed on Sep. 19, 2023.
Search Report of CN family patent Application No. 202110412031.8, mailed on Sep. 19, 2023.
English translation (brief) of the Search Report of CN family patent Application No. 202110412031.8, mailed on Sep. 19, 2023.
Second Office Action of CN family patent Application No. 202110412031.8, mailed on Mar. 14, 2024.
English translation (brief) of the second Office Action of CN family patent Application No. 202110412031.8, mailed on Mar. 14, 2024.

* cited by examiner

METHODS FOR MANUFACTURING A PLURALITY OF SEMICONDUCTOR STRUCTURES AND SYSTEM IN PACKAGE

PRIORITY CLAIM AND CROSS-REFERENCE

This application is a continuation application of prior-filed U.S. application Ser. No. 16/920,427, filed Jul. 3, 2020, which is a continuation-in-part of pending U.S. application Ser. No. 16/232,417, filed Dec. 26, 2018, the entire contents of which is incorporated herein by reference and claims the priority thereto.

This application also claims the benefit of prior-filed U.S. provisional application No. 63/021,608 filed May 7, 2020 and incorporates its entirety herein.

FIELD

The present disclosure relates to a semiconductor structure and method for manufacturing a plurality thereof, particularly, the disclosed semiconductor structure includes a memory structure integrated with a logic structure through wafer stacking technique.

BACKGROUND

Promise of high performance has given great boost to the realization of system-on-chip (SOC), as SOC, which embeds DRAM array to logic, is found to be a better solution where large amounts of data are to be communicated at high speed. However, merging of the DRAM and the logic requires reducing differences in manufacturing process. For an SOC, for example, compatibility of design rule between embedded DRAM and logic is essential.

Process of reconciling compatibility for the embedded DRAM and logic is mainly dependent on several different approaches, for example, the memory circuit is incorporated in a high performance technology optimized logic, or the logic circuit is incorporated in a technology-optimized high density low-performance DRAM. Each of the options includes pros and cons. Generally, huge advantages of merging the DRAM and logic on the same chip, but it does not come easy and the integration is challenging, that is, since logic process and DRAM process are not compatible on many counts, a new option in integrating these semiconductor structures is in need.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1A:
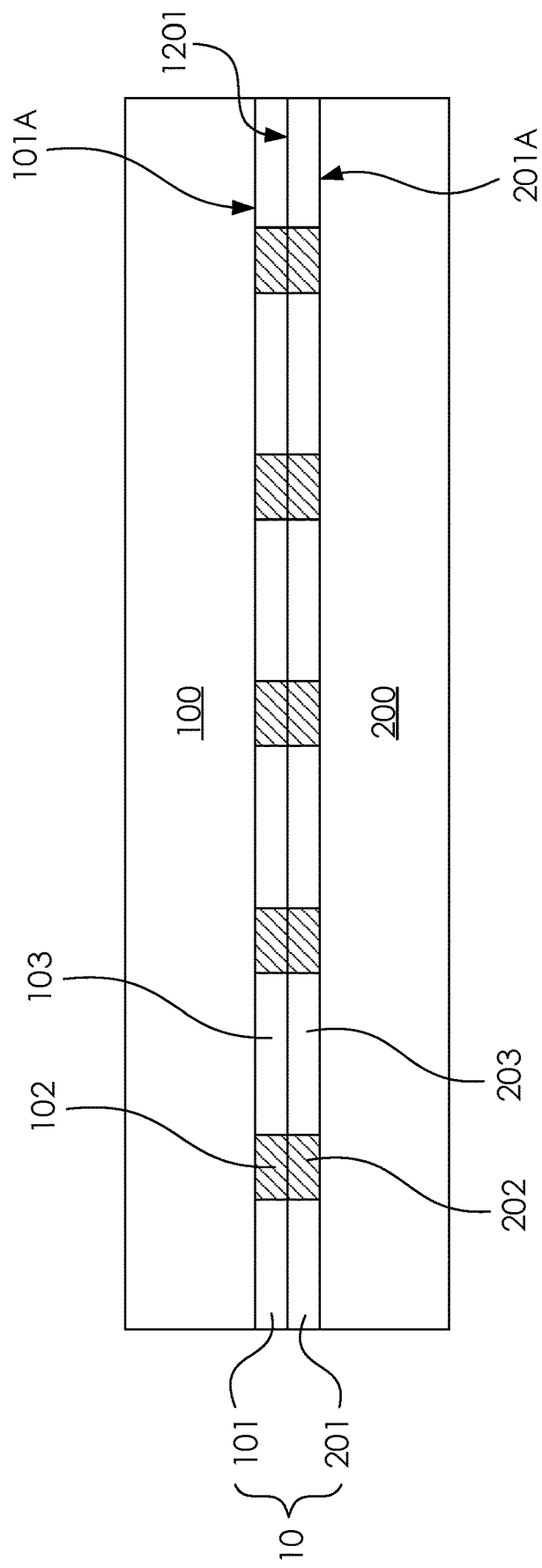
FIG. 1A illustrates a cross-sectional view of a semiconductor structure according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

For example, High bandwidth memory (HBM) is a type of CPU or GPU memory system that vertically stacks memory dies over a logic die. The stacked memory dies are performed as a memory tower with distinguishable floors over the logic die, wherein each two of the adjacent memory dies are connected by micro bumps and laterally surrounded by molding compounds. Though these HBM stacks are not physically integrated with the CPU or GPU, they are so closely and quickly connected via the interposer that HBM's characteristics are nearly indistinguishable from on-chip integrated RAM.

Generally speaking, prior to stacking the memory dies through micro bumping operations, the memory dies in such HBM structure are usually already diced and tested through several standard electrical test operations to obtain known good dies (KGD). The KGDs may then be stacked or packaged for higher end applications. Each of the memory dies is bonded through micro-bumps to form a memory stack (which may include a control circuit die) and said memory stack is further flip-chip bonded to a silicon interposer forming a chip-on-wafer (CoW) structure. The micro bumping operations lead to high production cost, the KGD selection leads to low production efficiency, and the post-stacking defects caused by the micro bumping operation leads to low production yield.

Accordingly, some embodiments of the present disclosure provide a memory structure integrated with a control circuit through wafer stacking instead of chip-on-wafer (CoW) operation. The control circuit may include one or more logic structures. Alternatively stated, the memory dies over the control circuit may be manufactured by hybrid bonding operations performed on a wafer-on-wafer (WoW) or wafer-to-wafer basis. The memory stacks (which may include a control circuit) can be diced or separated after the completion of the hybrid bonding operations. By doing so, the production efficiency in forming the memory stack may be enhanced tremendously, and the risk of stacking defects caused by the micro bumping operations can be greatly reduced. The omission of the KGD selection to the memory dies can be mitigated by providing a control circuit performing the testing operation upon the plurality of memory blocks in the memory dies without probing or testing machine involved, (e.g., U.S. application Ser. No. 16/899,166, "SEMICONDUCTOR DEVICE AND METHOD TO MANUFACTURE THE SAME"), which are incorporated by reference herein for all purposes.

FIG. 1A illustrates a semiconductor structure which includes a memory structure integrated with a control circuit structure through wafer stacking. In some embodiments, the control circuit structure may include at least one logic structure, for example, a transistor featuring a smallest line width in the semiconductor structure. As shown in the figure, the semiconductor structure includes a hybrid bonding structure 10, a memory structure 100 and a control circuit structure 200. The hybrid bonding structure 10 includes a first surface 101A and a second surface 201A opposite to the first surface 101A. The hybrid bonding structure 10 is sandwiched by the memory structure 100 and the control circuit structure 200. The hybrid bonding structure 10 is configured to integrate the memory structure 100 and the control circuit structure 200. In such embodiments, the memory structure 100 is contact with the first surface 101A of the hybrid bonding structure 10. The control circuit structure 200 is in contact with the second surface 201A of the hybrid bonding structure 10.

In some embodiments, the hybrid bonding structure 10 includes a first hybrid bonding layer 101 in proximity to the memory structure 100 and a second hybrid bonding layer 201 in proximity to the control circuit structure 200. The first hybrid bonding layer 101 is formed on the memory structure 100 and configured to bond to the second hybrid bonding layer 201. The second hybrid bonding layer 201 is formed on the control circuit structure 200 and configured to bond to the first hybrid bonding layer 101. In some embodiments, each of the first hybrid bonding layer 101 and the second hybrid bonding layer 201 includes a plurality of bond pads laterally surrounded by dielectric material, for example, oxide materials.

Figure 1B:
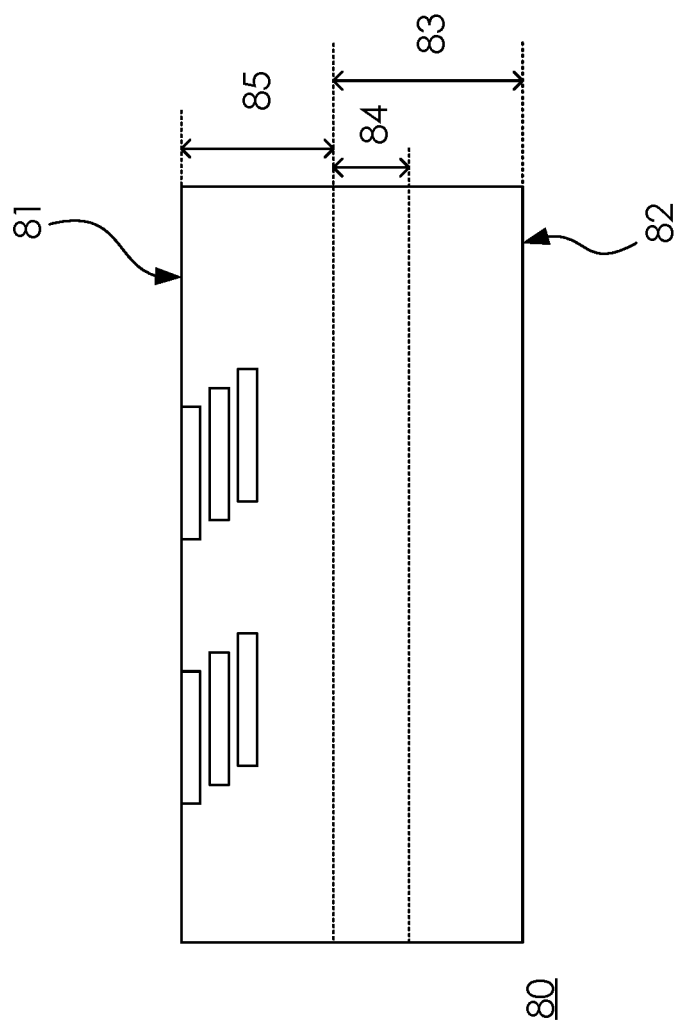
FIG. 1B illustrates a definition of a face side and a back side of a semiconductor structure or a semiconductor wafer.

Hybrid bonding is a method which may connect two substrates or wafers by metal bonding and by oxide bonding at the same time; that is, allowing face-to-face or face-to-back, or back-to-back connections of substrates or wafers. For the purpose of illustration, FIG. 1B shows a definition of a face side and a back side of a semiconductor structure or a semiconductor wafer. For a semiconductor structure 80 (e.g. the memory structure 100 or the control circuit structure 200 as previously shown in FIG. 1A) or a wafer, the semiconductor structure may comprise a semiconductor substrate 83 and a back-end-of-line (BEOL) structure 85, in which a front-end-of-line (FEOL) structure 84 is formed in/on the semiconductor structure 83. According to the embodiments, the surface of the BEOL structure 85 may be the face side 81 of the semiconductor structure 80, and the surface of the semiconductor substrate 83 may be the back side 82 of the semiconductor structure 80. However, this is not a limitation of the present embodiments. The definition of the face side and the back side of a semiconductor structure may be switched. Accordingly, in some embodiments, the positions of the memory structure 100 and the control circuit structure 200 may be aligned vertically and therefore a plurality of first bond pads 102 of the first hybrid bonding layer 101 may be in contact with a plurality of second bond pads 202 of the second hybrid bonding layer 201, whereas a plurality of first oxide portions 103 of the first hybrid bonding layer 101 are in contact with a plurality of second oxide portions 203 of the second hybrid bonding layer 201. In such embodiments, the distribution of the first bond pads 102 of first hybrid bonding layer 101 is a mirror image of the distribution of the second bond pads 202 of second hybrid bonding layer 201.

In some embodiments, the first bond pads 102 and the second bond pads 202 are made by copper (Cu). In some embodiments, the first oxide portions 103 and the second oxide portions 203 are made by dielectric materials such as silicon oxide ($SiO_2$). In order to robust Cu—Cu connection, the control of the surface flatness of bond pads is an important factor. For instance, in some embodiments, the surface of the Cu bond pads may be controlled to be substantially coplanar to that of the $SiO_2$ portions by performing a chemical mechanical polishing (CMP) operation. Depending on the hybrid bonding operations, in some embodiments, the $SiO_2$ portions can be slightly protruding from the Cu bond pads. In the present disclosure, for example, the memory structure 100 and the control circuit structure 200 may be bonded by first drawing the first oxide portions 103 into contact with the second oxide portions 203, the aforesaid oxide portions may be bonded via Van der Waals force, subsequently, an annealing operation may be implemented to foster the connection of the first bond pads 102 and the second bond pads 202.

In some embodiments, the control circuit structure 200 is a DRAM control logic. In some embodiments, in addition to controlling the memory structure 100, the control circuit structure 200 may further function as a system on chip (SoC) die integrated with GPU/CPU.

Figure 2:
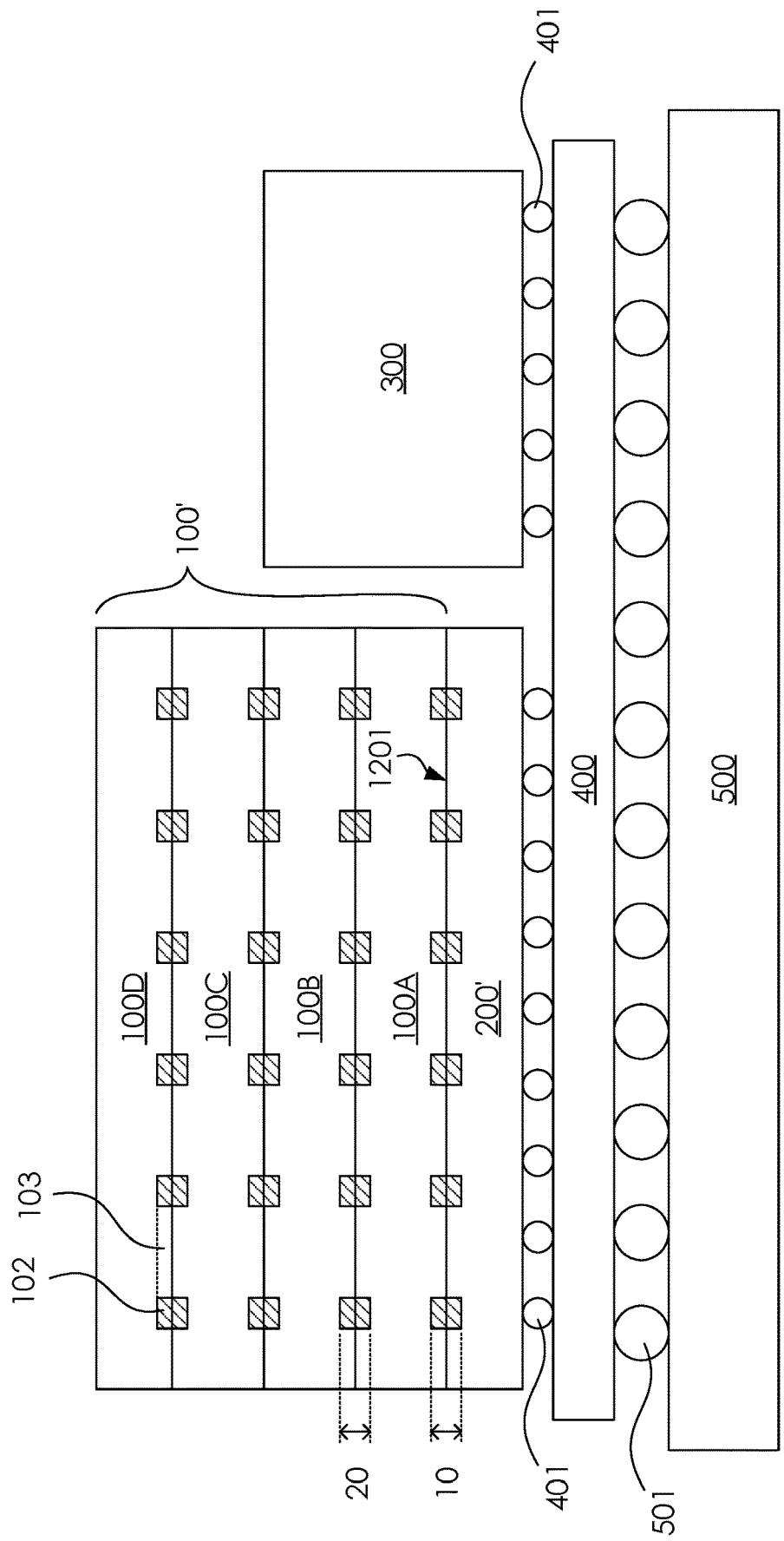
FIG. 2 illustrates a cross-sectional view of a semiconductor structure according to some embodiments of the present disclosure.

As shown in FIG. 2, the semiconductor structure of the present disclosure may include a system in package (SiP) structure. In such embodiments, the SiP structure includes a first semiconductor structure 100', a second semiconductor structure 200', and a substrate 500. The second semiconductor structure 200' is stacked with the first semiconductor structure 100'. The second semiconductor structure 200' is in contact with the first semiconductor structure 100' through the hybrid bonding interface 1201. The substrate 500 is electrically connected to the first semiconductor structure 100' and the second semiconductor structure 200' through a first conductive bump connection 501. The first conductive bump connection 501 may include a plurality of solders, wherein the solders may be surrounded by suitable underfill materials (not shown in the figure).

In some embodiments, the first semiconductor structure 100' may include a plurality of memory dies (i.e., the memory dies 100A, 100B, 100C, 100D, etc.) vertically stacked over the second semiconductor structure 200'. In some embodiments, at least two of the memory dies are hybrid bonded by a second hybrid bonding structure 20. In some embodiment, two of the adjacent memory dies are hybrid bonded by the second hybrid bonding structure 20. The details of the second hybrid bonding structure 20 are similar to that of the first hybrid bonding structure 10 as previously discussed, but the mirroring bond pad distribution is formed on two adjacent memory dies. In some embodiments, the each memory dies of the first semiconductor structure 100' may include DRAM structures having a first critical dimension (i.e., the smallest line width implemented in said structure via photolithography operations). Similarly, the second semiconductor structure 200' may include at least a logic structure having a second critical dimension (i.e., the smallest line width implemented in said structure via photolithography operations). The first critical dimension is different from the second critical dimension due to the fact that different technology nodes may be implemented to manufacture the first semiconductor structure 100' and the second semiconductor structure 200'. In one embodiment, the first critical dimension is smaller than the second critical dimension when a more advanced technology node may be implemented in manufacturing the first semiconductor structure 100'. In another embodiment, the first critical dimension is greater than the second critical dimension when a more advanced technology node may be implemented in manufacturing the second semiconductor structure 200'. It is noted that the first critical dimension may equal to the second critical dimension when the first semiconductor structure 100' and the second semiconductor structure 200' are manufactured by the same technology node.

In the present disclosure, the number of the memory dies vertically stacked by hybrid bonding over the second semiconductor structure 200' may be customized. For example, referring to the fact that there may be four or eight memory dies stacked over a control circuit or logic die by micro bumping in the conventional structure, accordingly, some embodiments of the present disclosure vertically stacks four memory dies over the second semiconductor structure 200' by hybrid bonding as examples, but not be limited to such number or range.

In some embodiments, the second semiconductor structure 200' is a DRAM control logic. In some embodiments, the second semiconductor structure 200' is bonded to the memory die 100A of the first semiconductor structure 100' through the first hybrid bonding structure 10 as previously shown in FIG. 1A. In some embodiments, the bonding structures within the first semiconductor structure 100' and that between the first semiconductor structure 100' and the second semiconductor structure 200' are different to the bonding structures between the second semiconductor structure 200' and the substrate 500. For example, the first hybrid bonding structure 10 and the second hybrid bonding structure 20 are formed by suitable hybrid bonding operations which can be characterized by a hybrid bonding interface 1201, whereas the first conductive bump connection 501 is formed by suitable micro bumping operation which a plurality of solder bumps can be observed.

In some embodiments, the SiP structure may include a third semiconductor structure 300 electrically connected to the first semiconductor structure 100' and the second semiconductor structure 200' through a second conductive bump connection 401. The second conductive bump connection 401 may include a plurality of solders, wherein the solders may be surrounded by suitable underfill materials (not shown in the figure). In some embodiments, the third semiconductor structure 300 has a third critical dimension smaller than a first critical dimension of the first semiconductor structure 100'. In some embodiments, the third semiconductor structure 300 is immediately adjacent to the stack of the first semiconductor structure 100' and the second semiconductor structure 200'. In some embodiments, the third semiconductor structure 300 is a SoC serving the function of a GPU/CPU.

In some embodiments, the SiP structure may include an interposer 400 between the substrate 500 and the second semiconductor structure 200'. The interposer 400 may be used to support the first semiconductor structure 100', the second semiconductor structure 200', and the third semiconductor structure 300. Although not illustrated in FIG. 2, the interposer 400 is electrically connected to the semiconductor structures 100' and 200' and the substrate 500 by the second conductive bump connection 401, the first conductive bump connection 501, and a redistribution layer laterally routing the signals between the third semiconductor structure 300 and the second semiconductor structure 200'. The redistribution layer of the interposer 400 may also adapt a higher density I/O proximal to the second semiconductor structure 200' to a lower density I/O proximal to the substrate 500.

As previously mentioned, hybrid bonding may allow two substrates or wafers be connected in schemes of face-to-face or face-to-back arrangement. In some embodiments, the different schemes of the hybrid bonding and the alternative sequences for fabricating the vias in each of the memory dies and logic dies may induce different application forms in stacking the substrates or wafers with the memory dies and logic dies.

Figure 3:
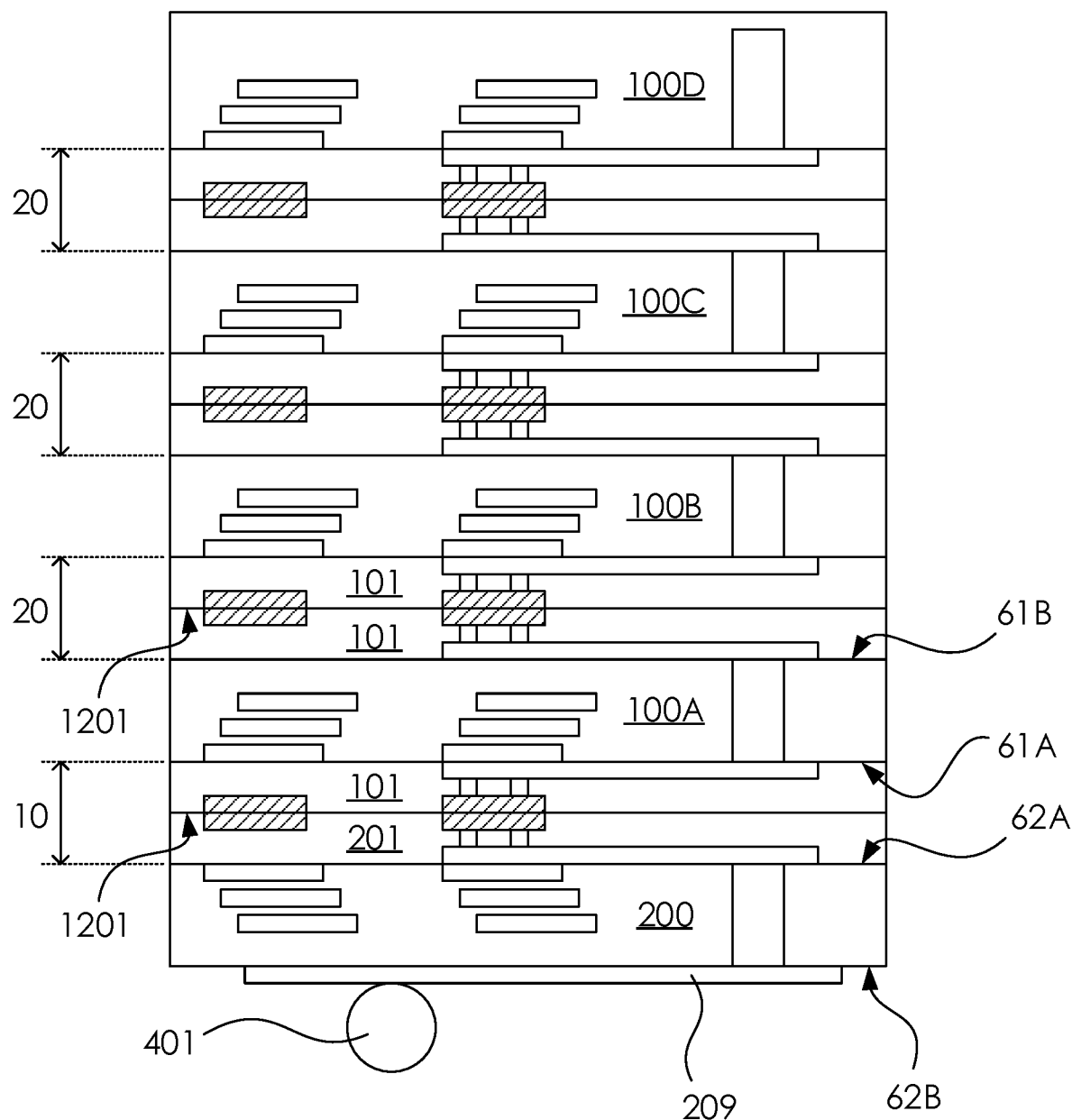
FIG. 3 illustrates a cross-sectional view of a semiconductor structure according to some embodiments of the present disclosure.

As shown in FIG. 3, in some embodiments, each of the memory structures and the control circuit structure are manufactured through a via-last process. Through such via-last process, the forming of a through silicon via (TSV) is performed after the transistor formation and wiring, that is, both of the front-end-of-line (FEOL) structure and the back-end-of-line (BEOL) structure are formed prior to the via etching and the via filling operations. In such embodiments, the logic die and the memory die may be stacked in a face-to-face arrangement, whereas the memory dies in the memory structures are stacked in a face-to-back arrangement (Scheme I). On the other hands, the distraction of the bonding pads on the logic die and the same on the memory die are mirror images of each other. Moreover, in the embodiments having the stacking arrangement as Scheme I, the second surface 201A of the hybrid bonding structure 10 previously shown in FIG. 1 is closer to a BEOL structure of the control circuit structure 200 and further from a FEOL structure of the control circuit structure 200.

As shown in FIG. 3, each of the memory dies includes a first face side 61A and a first back side 61B since it is fabricated form a first wafer 61 (later shown in FIG. 4A), and the control circuit structure 200 also includes a second face side 62A and a second back side 62B since it is fabricated form a second wafer 62 (later shown in FIG. 4A). The first hybrid bonding structure 10 is sandwiched by the control circuit structure 200 and the memory die 100A. Moreover, each of the second hybrid bonding structures 20 are sandwiched by the adjacent memory dies, such as the memory dies 100A and 100B. In some embodiments, each of the second hybrid bonding structures 20 includes two first hybrid bonding layers 101, wherein the bond pad distribution on these first hybrid bonding layers 101 are mirror images of each other along the hybrid bonding interface 1201.

Figure 4A:
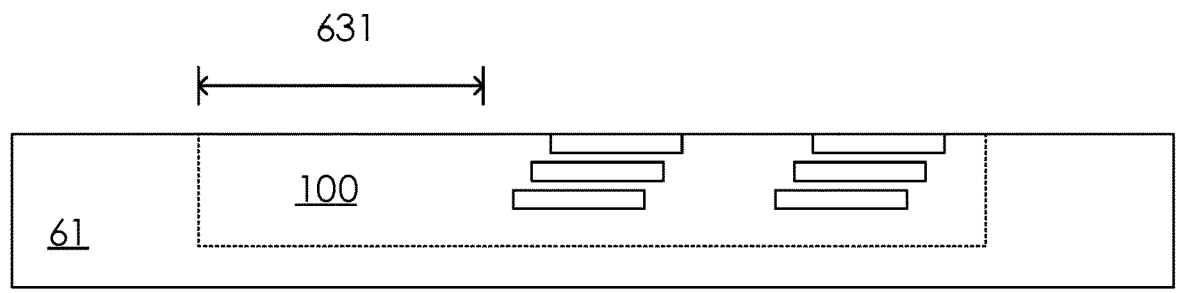
FIGS. 4A to 4J illustrate cross-sectional views of forming a semiconductor structure according to some embodiments of the present disclosure.
Figure 4A:
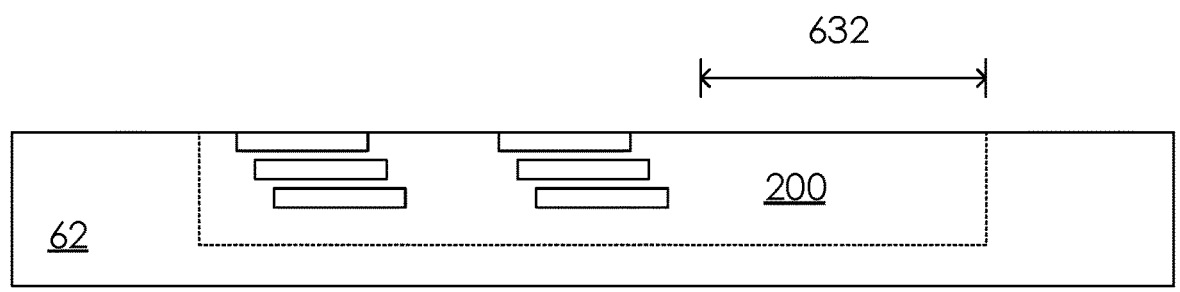

In manufacturing the semiconductor structure as shown in FIG. 3, the operations thereof may refer to FIGS. 4A to 4J. As shown in FIG. 4A, in some embodiments, prior to the hybrid bonding operation, the memory structures 100 (i.e., memory dies) and the control circuit structures (i.e., logic dies) 200 are formed on the first wafer 61 and the second wafer 62, respectively. Each of the first wafers 61 and the second wafers 62 may include a plurality of die regions, and the present disclosure only shows one of the die regions in the illustration. In some embodiments, within the region of each of the memory structures 100, a first reserved region 631 may be included. Likewise, a second reserved region 632 may be included within the region of each of the control circuit structures 200. The first reserved region 631 and the second reserved region 632 are reserved for forming the TSVs in following operations because the distribution of the bond pads may be associated with the location of the TSV. As previously discussed, since the distribution of the bond pads in the hybrid bonding layers shall be mirror images to each other, the aforesaid reserved regions 631/632 may be planned before hand when designing the layout of each of the memory structures 100 (i.e., memory dies) and the control circuit structures (i.e., logic dies) 200.

Figure 4B:
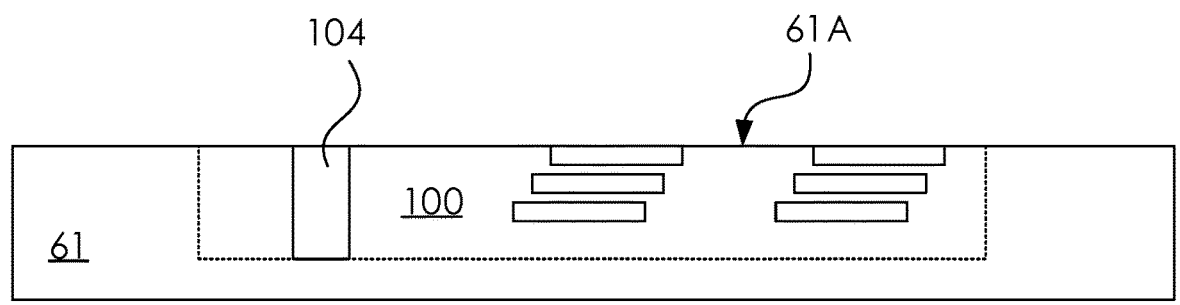
Figure 4B:
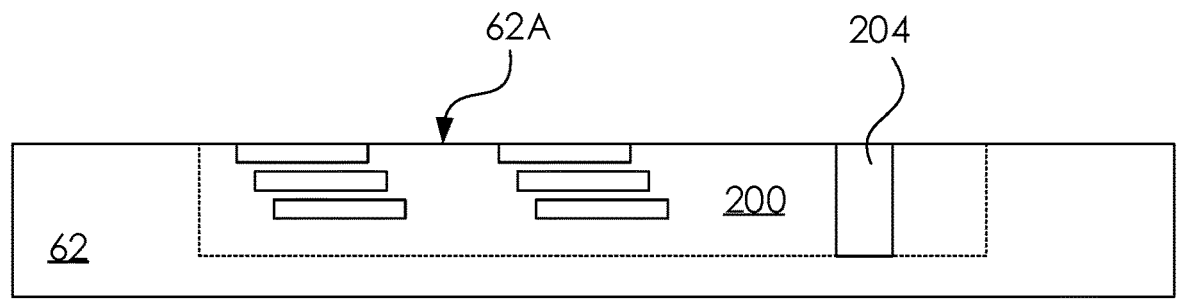

As shown in FIG. 4B, a first TSV 104 and a second TSV 204 are formed adjacent to a first face side 61A of the first wafer 61 and a second face side 62A of the second wafer 62, respectively. In some embodiments, the first TSV 104 and the second TSV 204 are formed through a via etching operations, and then the via holes are filled with conductive materials through electroplating operations. During the operation stage illustrated in FIG. 4B, the first TSV 104 and the second TSV 204 may only have one end exposing from the corresponding wafer 61 and 62, however, in the subsequent wafer thinning operation (illustrated in FIG. 4F and FIG. 4I), both ends of the first TSV 104 and the second TSV 204 may be exposed.

Figure 4C:
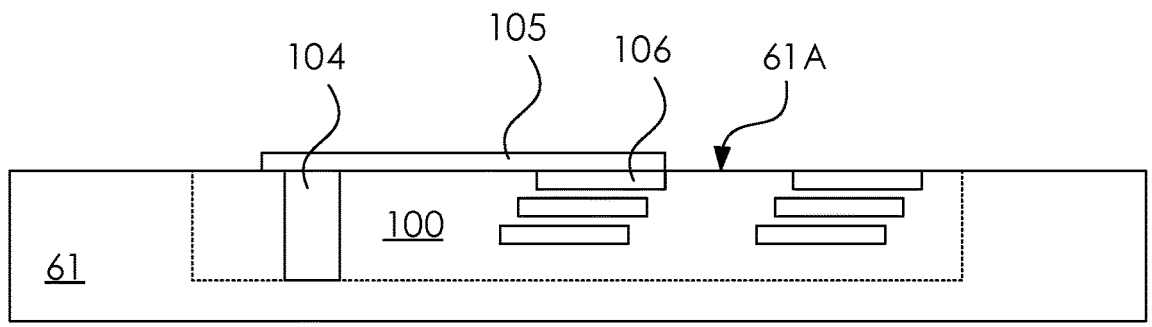
Figure 4C:
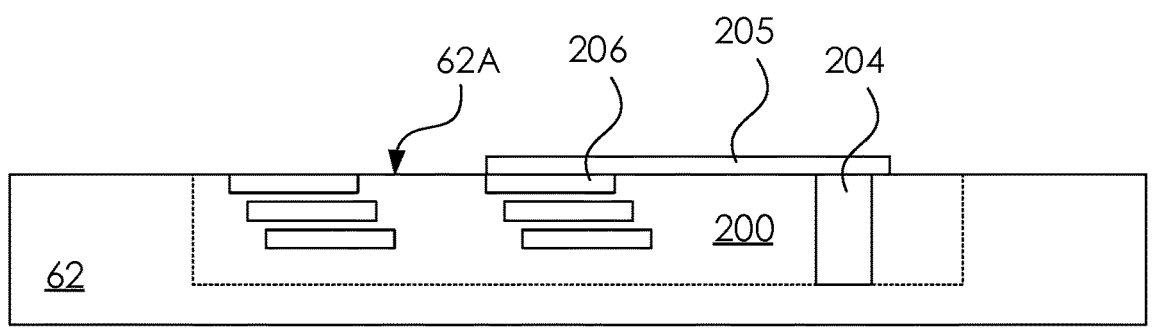

As shown in FIG. 4C, in some embodiments, after the first TSV 104 and the second TSV 204 are formed, a first metal layer 105 may be formed on the first face side 61A of the first wafer 61 to connect the first TSV 104 and a top metal 106. Likewise, a second metal layer 205 may be formed on the second face side 62A of the second wafer 62 to connect the second TSV 204 and a top metal 206.

Figure 4D:
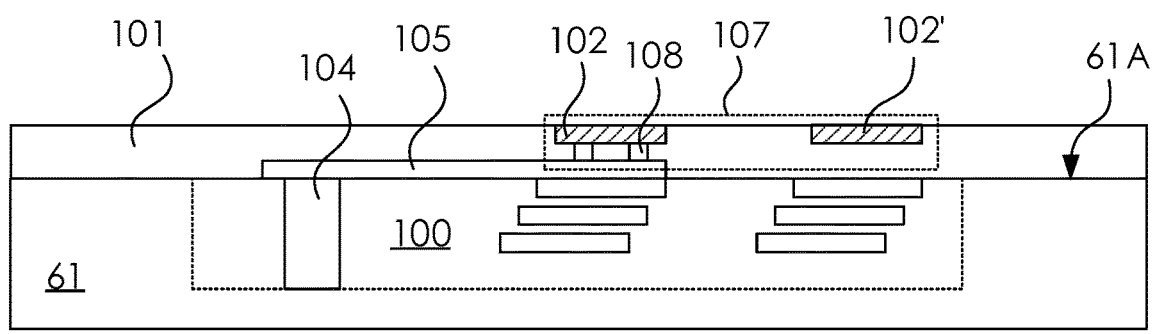
Figure 4D:
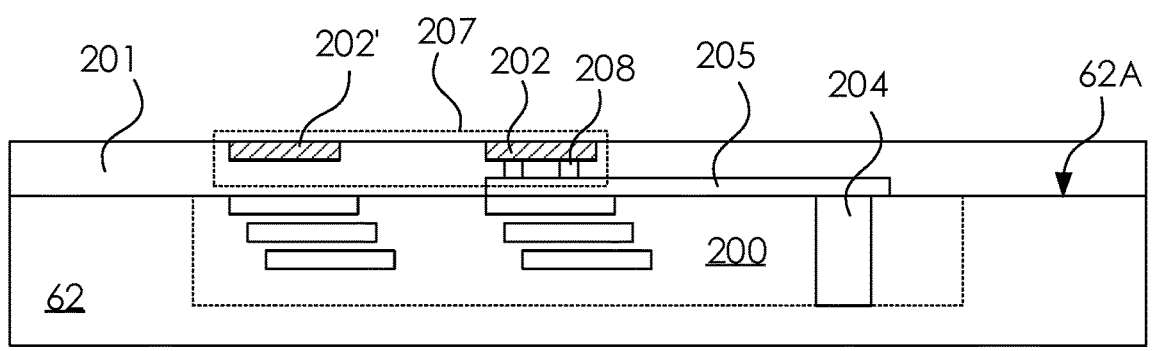

As shown in FIG. 4D, in some embodiments, the first hybrid bonding layer 101 is formed over the first face side 61A of the first wafer 61. Likewise, the second hybrid bonding layer 201 is formed over the second face side 62A of the second wafer 62. In some embodiments, the first hybrid bonding layer 101 includes the first bond pads 102 as previously shown in FIG. 1A. In some embodiments, the first hybrid bonding layer 101 further includes a plurality of first conductive vias 108 in a first hybrid portion 107 thereof. In other words, the first hybrid portion 107 may include a metal via structure connecting the first bond pad 102 and the first metal layer 105. Because the first conductive vias 108 may design to possess a small dimension (e.g., small diameter), to prevent connection defects caused by manufacturing operations, a plurality of first conductive vias 108 are formed to correspond to the first bond pad 102 in order to increase the production yield. The first TSV 104 may be coupled to an end of the first conductive vias 108 through the first metal layer 105, and the first bond pad 102 may in contact with another end of the first conductive via 108. Similarly, in some embodiments, the second hybrid bonding layer 201 further includes a plurality of second conductive vias 208 in a second hybrid portion 207 thereof. The second TSV 204 may be coupled to an end of the second conductive via 208 through the second metal layer 205, and the second bond pad 202 may in contact with another end of the second conductive vias 208. The conductive vias in such embodiments may strengthen the connectivity from the bond pads to the TSVs.

Moreover, in some embodiments, the first hybrid bonding portion 107 may further include a third bond pad 102' which is electrically disconnected from the memory structure 100. That is, the third bond pad 102' is a dummy bond pad that only serving the purpose for hybrid bonding, without being coupled to the first metal layer 105. Similarly, the second hybrid bonding portion 207 may further include a fourth bond pad 202' which is electrically disconnected from the control circuit structure 200. The third bond pad 102' may be utilized to be hybrid bonded to the fourth bond pad 202' in subsequent hybrid bonding operation.

Figure 4E:
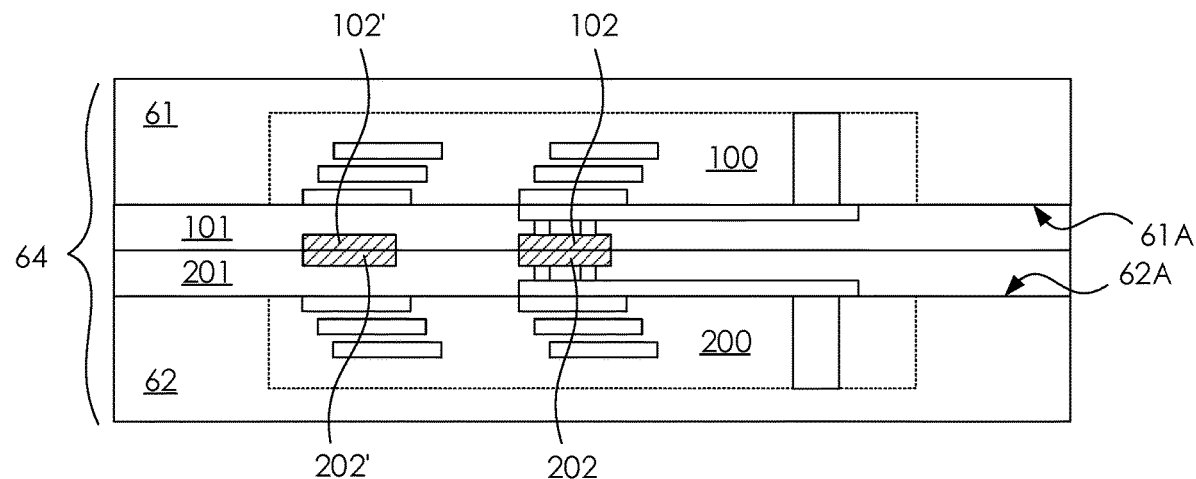

As shown in FIG. 4E, the first wafer 61 is flipped to be stacked on the second wafer 62 by a hybrid bonding operation, wherein the first face side 61A is facing the second face side 62A and a face-to-face stack is thus performed. In such stacking, the first bond pad 102 is in contact with the second bond pad 202 for hybrid bonding and electrical connection, whereas the third bond pad 102' is in contact with the fourth bond pad 202' solely for hybrid bonding. In some embodiments, the first wafer 61 and the second wafer 62 are hybrid bonded under suitable conditions. In some embodiments, the first TSV 104 and the second TSV 204 are formed at the first reserved region 631 and the second reserved region 632, after the hybrid bonding operation, one can observe that the first TSV 104 and the second TSV 204 are at the same side of the first bond pad 102 and the second bond pad 202 in the stacked structure.

By hybrid bonding the first wafer 61 and the second wafer 62 through the hybrid bonding operation as abovementioned, the first bonding layer 101 on the first wafer 61 and the second bonding layer 201 on the second wafer 62 are connected, and a first bonded wafer 64 is obtained thereby. In some embodiments, the first bonded wafer 64 may be singulated subsequently to obtain a plurality of semiconductor structures, wherein each of them includes a memory structure 100 and a control circuit structure 200 as previously shown in FIG. 1A. In some other embodiments, and will be discussed in FIG. 4F to FIG. 4G, prior to the singulation operation, there may be additional wafers similar to the first wafers 61 bonded over the first bonded wafer 64 to stack extra number of memory dies over the logic die on a wafer-to-wafer basis, depending on the product requirement and current state of the art.

Figure 4F:
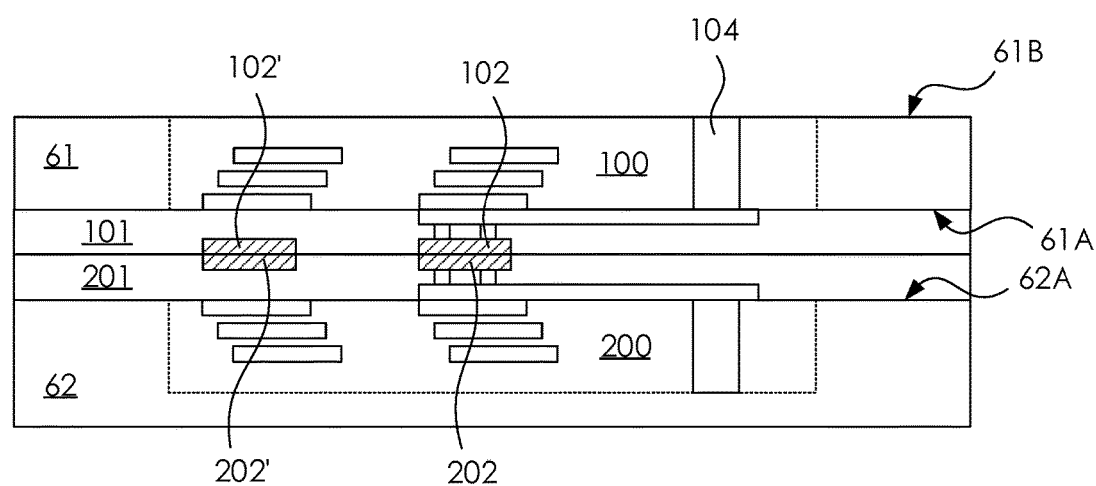

As shown in FIG. 4F, in some embodiments, the first wafer 61 is thinned from a first back side 61B to expose the first TSV 104 after bonding the first wafer 61 and the second wafer 62. The thinning operation may be implemented by mechanical polishing, chemical-mechanical polishing (CMP), wet etching, dry etching, or combination thereof. In some embodiments, the thickness of the first wafer 61 is thinned to be less than about 50 μm.

Figure 4G:
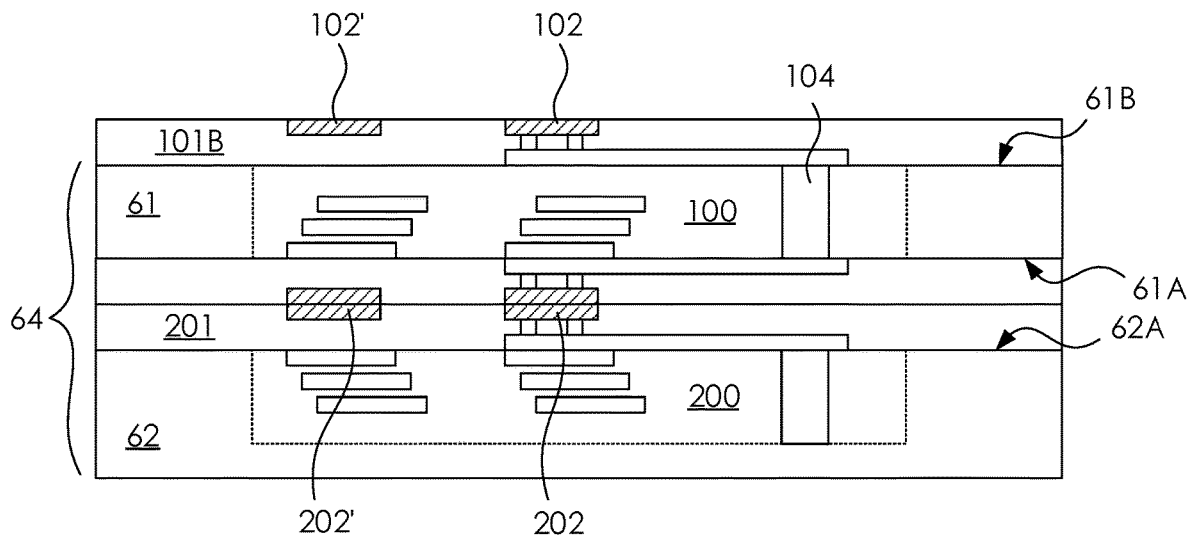
Figure 4H:
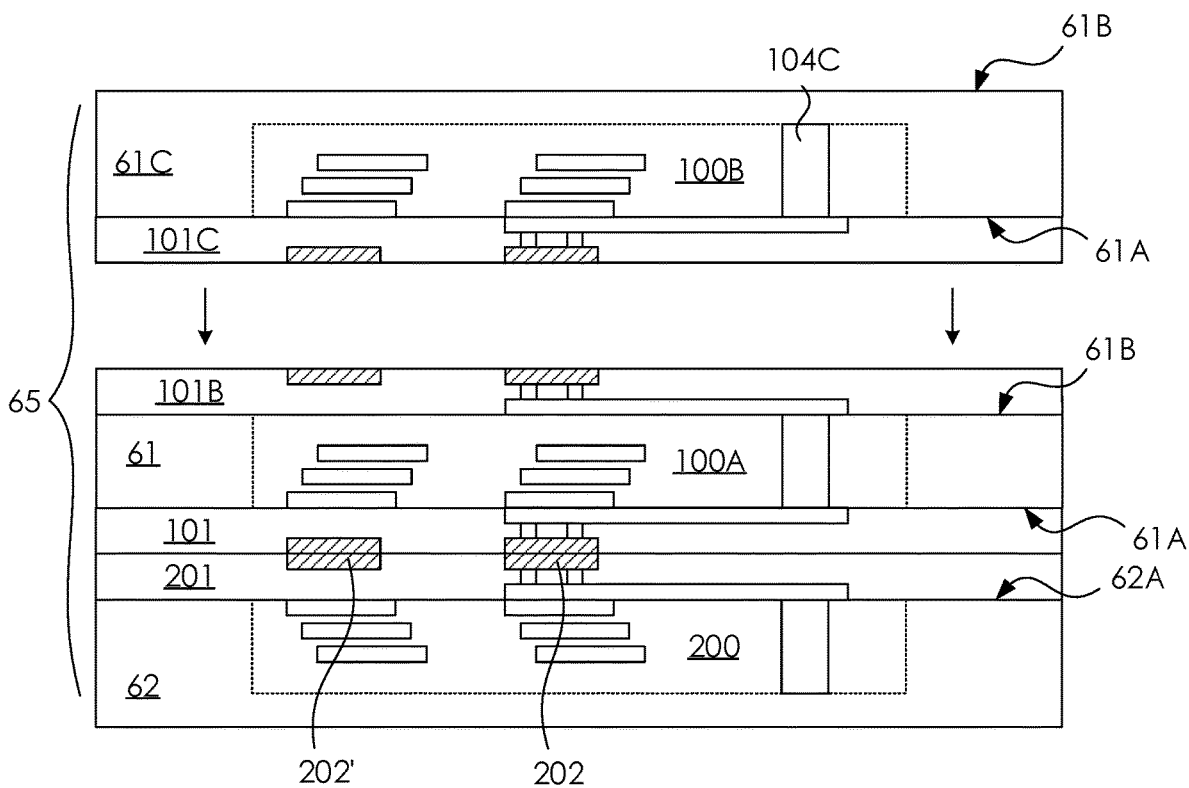

As shown in FIG. 4G, in some embodiments, another first hybrid bonding layer, such as a fourth hybrid bonding layer 101B shown in the figure, may be formed on the first bonded wafer 64 and electrically connected to the exposed first TSV 104. Furthermore, as shown in FIG. 4H, in some embodiments, another first wafer, such as a third wafer 61C with a third hybrid bonding layer 101C shown in the figure, may be stacked on the fourth hybrid bonding layer 101B formed in previously shown in FIG. 4G through a hybrid bonding operation. Within the third wafer 61C, a third TSV 104C adjacent to the first face side 61A of the third wafer 61C may be formed prior to forming the third hybrid bonding layer 101C over the third wafer 61C.

Through the hybrid bonding operation, the third hybrid bonding layer 101C and the fourth hybrid bonding layer 101B may be connected accordingly, and a second bonded wafer 65 is obtained thereby. The second bonded wafer 65 may be thinned to expose the third TSV 104C for another round of stacking operation. That is, the stack of the memory dies is substantially formed by repeatedly forming a memory wafer similar to the first wafers 61 with a first hybrid bonding layer 101 thereon and forming a first hybrid bonding layer 101, until total four or eight wafers are stacked through a plurality of hybrid bonding operations. In such embodiments, the memory wafer similar to first wafers 61 are stacked with an identical orientation, which means the memory dies in the memory structures are stacked with a face-to-back arrangement.

Figure 4I:
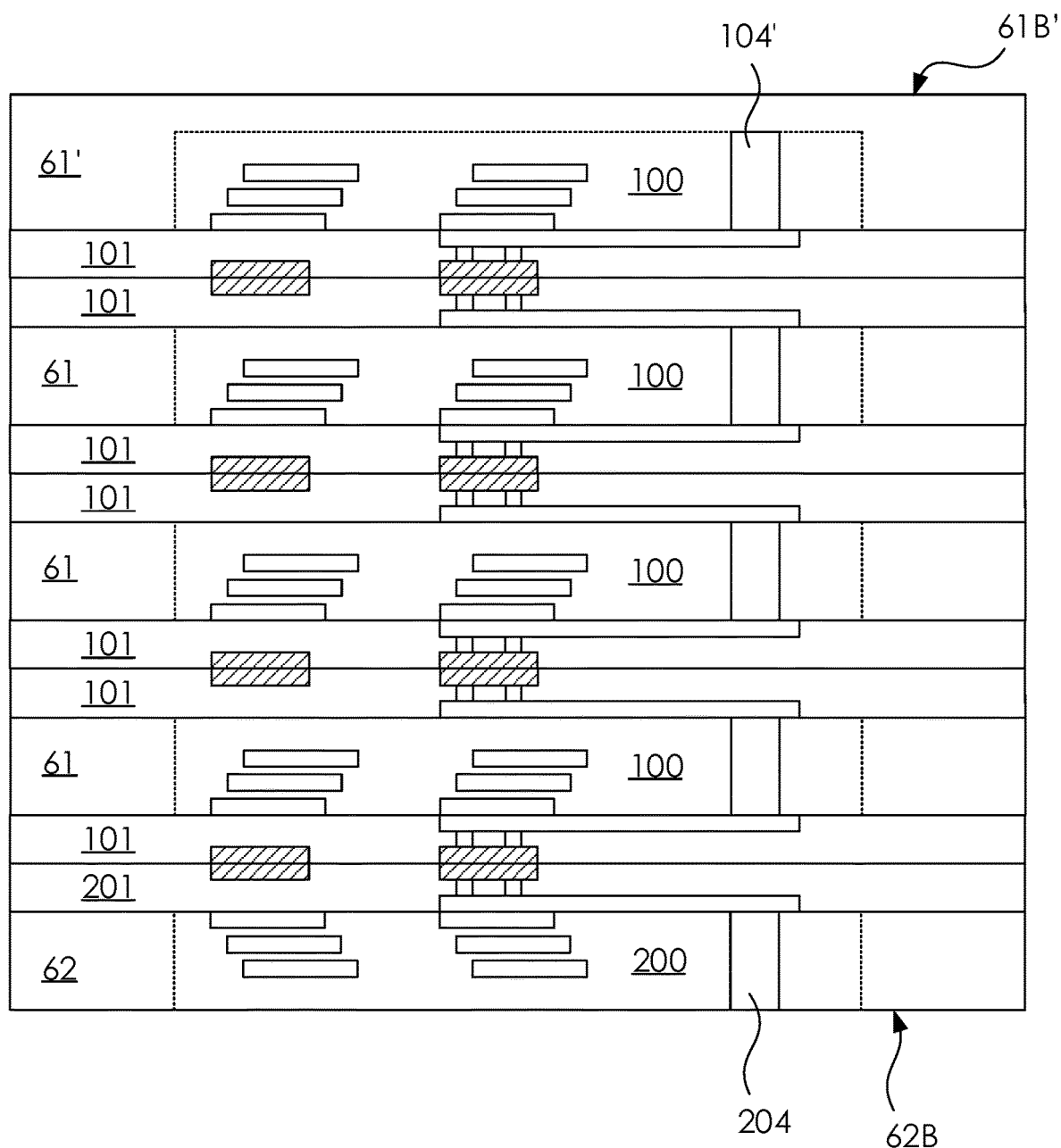

As shown in FIG. 4I, in some embodiments, a top first wafer 61' may omit the thinning operation as previously shown in FIG. 4F because no first hybrid bonding layer is required to be formed thereon. Accordingly, a top first TSV 104' may not exposed from a top first back side 61B' of the top first wafer 61', and a thickness of a top memory die of the memory dies is greater than a thickness of at least one memory die disposed between the top memory die and the control circuit structure 200. In some embodiments, after the memory dies are stacked by hybrid bonding, a second back side 62B of the second wafer 62 is thinned to expose the second TSV 204. The thinning operation may be implemented by mechanical polishing, chemical-mechanical polishing (CMP), wet etching, dry etching, or combination thereof. In some embodiments, the thickness of the second wafer 62 is thinned to be less than about 50 μm.

Figure 4J:
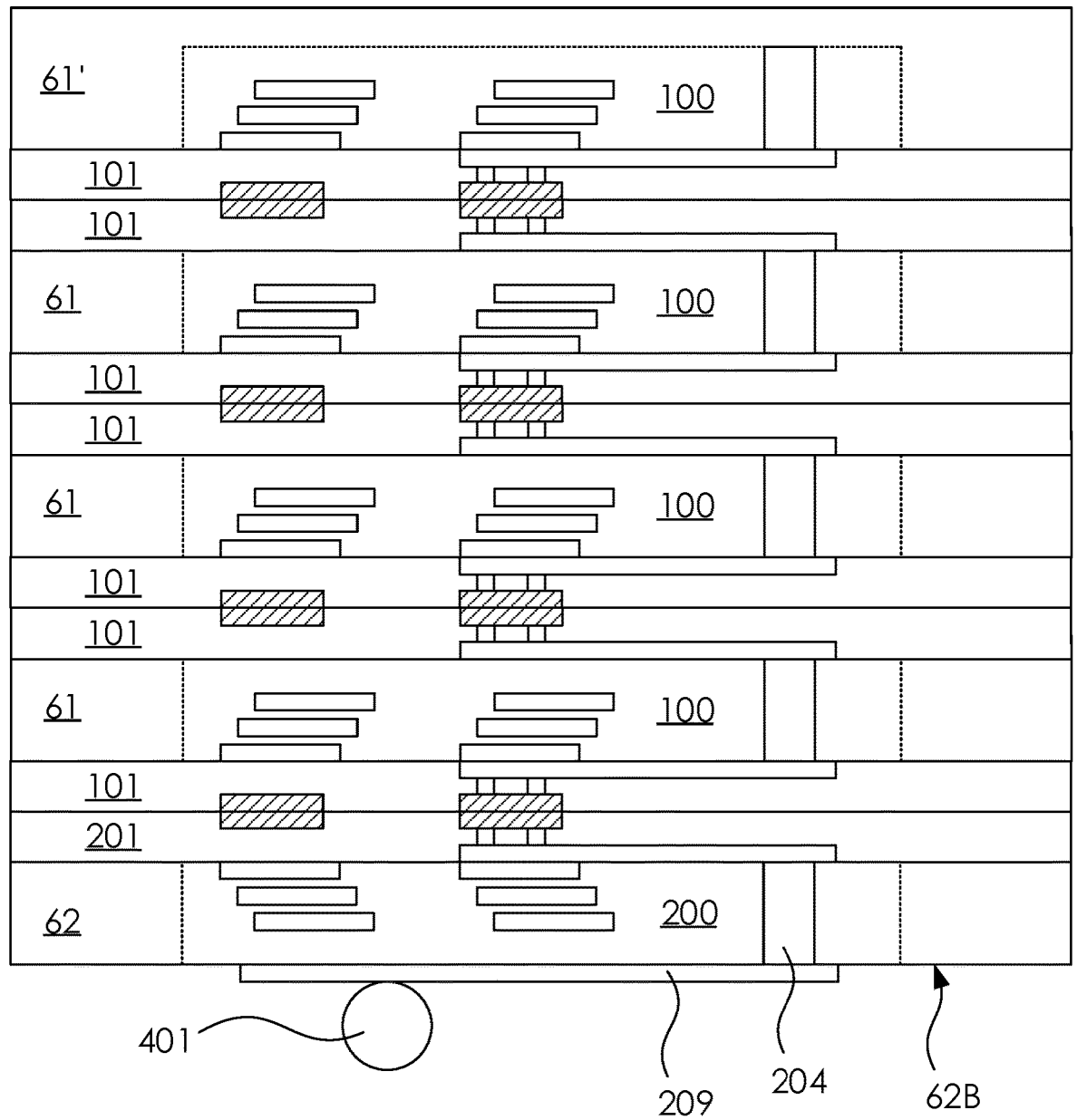

As shown in FIG. 4J, after the second wafer 62 is thinned from the second back side 62B, a bottom metal layer 209 may be formed on the second back side 62B to electrically connected to the second TSV 204. Next, the second conductive bump connection 401 may be disposed in contact with the bottom metal layer 209 for electrically connected to the interposer 400.

Figure 5A:
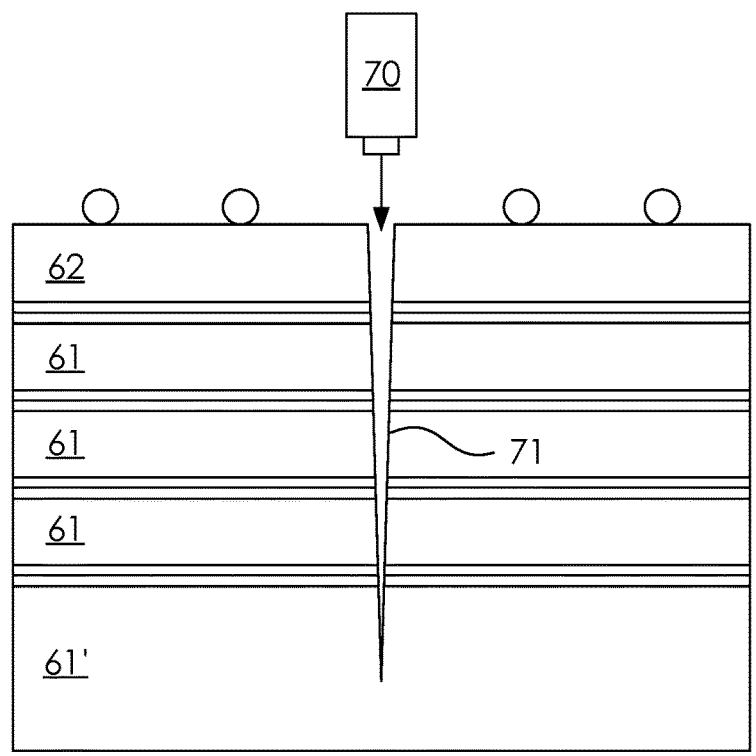
FIGS. 5A to 5B illustrate cross-sectional views of forming a semiconductor structure according to some embodiments of the present disclosure.
Figure 5B:
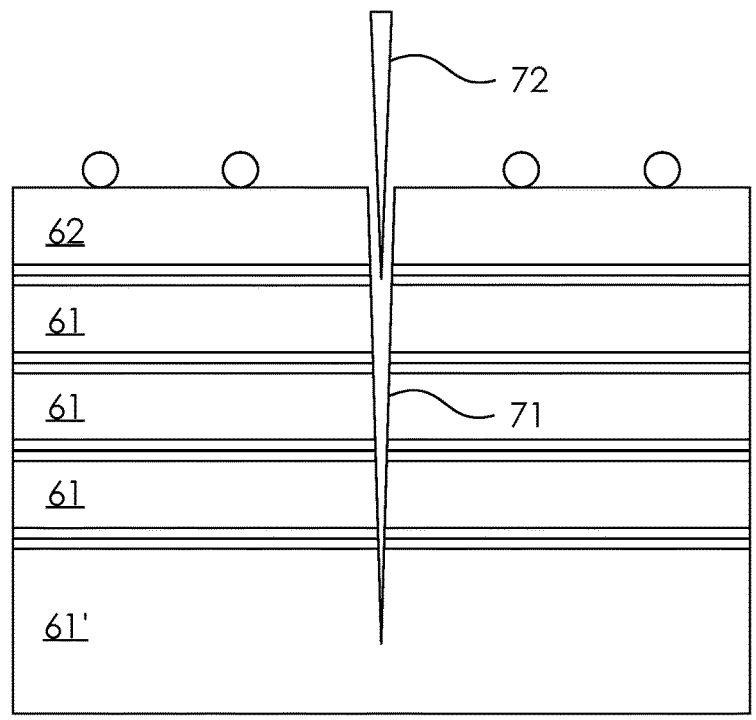

Prior to disposing the control circuit structure 200 and the memory structure 100 stacked on the interposer 400, the stacked second wafer 62 and the first wafers 61 may be singulated to obtain a plurality of semiconductor structures as previously shown in FIG. 3. As shown in FIG. 5A, in some embodiments, the operation of singulating the bonded wafer (i.e., first bonded wafer 64 or the second bonded wafer 65) includes performing a laser scribing operation. In some embodiments, a laser 70 may be utilized to cut through at least some of the stacked wafers. In some embodiments, the non-thinned wafer (e.g., the top first wafer 61' in FIG. 4I) may be used as a bulk substrate and a cut 71 formed by the laser scribing may stop in the bulk substrate. In some embodiments, a mechanical dicing operation may follow the laser scribing operation, for example, as shown in FIG. 5B, using a mechanical saw 72 to cut through the bulk substrate of the top first wafer 61' and completely separate individual memory stack.

Figure 6A:
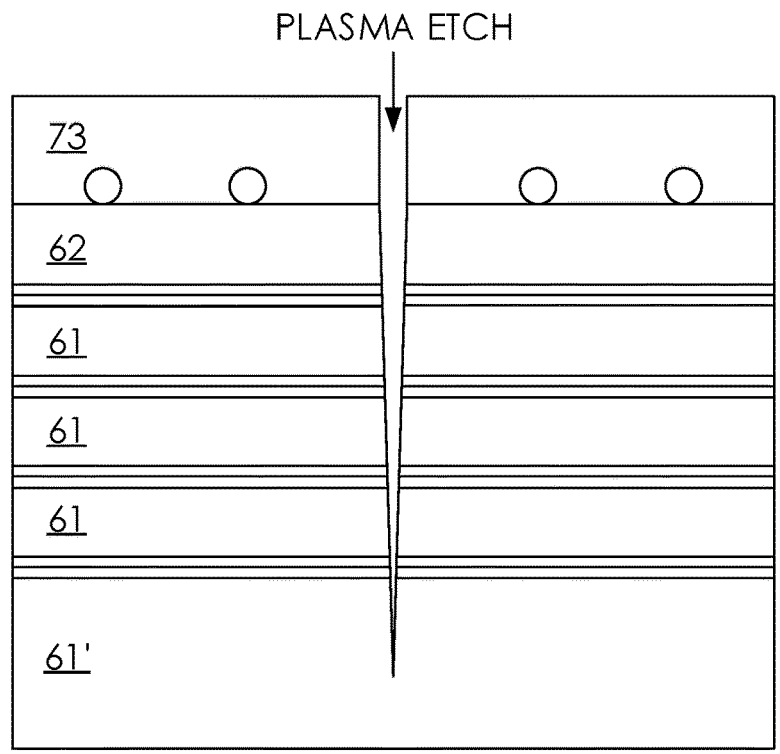
FIGS. 6A to 6B illustrate cross-sectional views of forming a semiconductor structure according to some embodiments of the present disclosure.
Figure 6B:
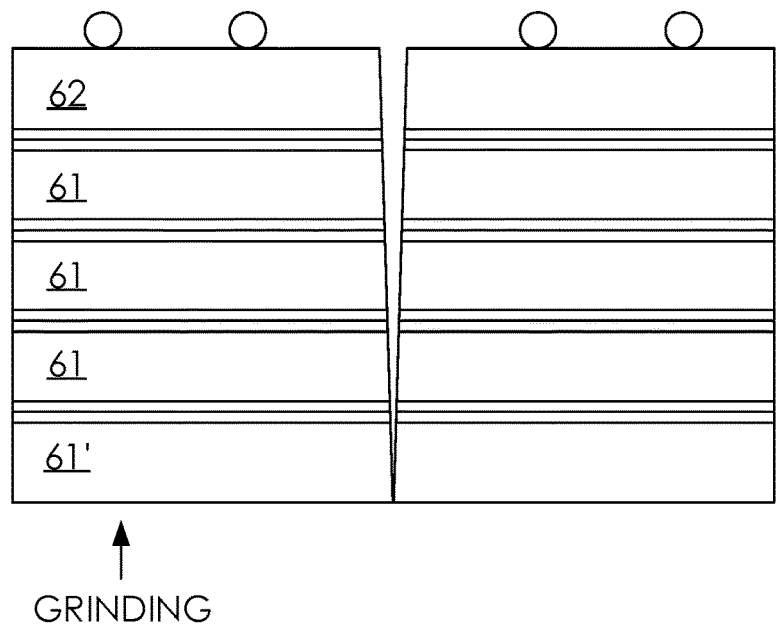

In some other embodiments, the operation of singulating the first wafers and the second wafer may include performing a plasma etching operation. As shown in FIG. 6A, a photoresist layer 73 may be disposed on the side of the wafer stack opposite to the bulk substrate of the top first wafer 61', and a plasma anisotropic etch may form a groove stopped in the bulk substrate. As shown in FIG. 6B, subsequently, a grinding operation may be performed in the bulk substrate of the top first wafer 61' following the plasma etching operation to completely separate individual memory stack. However, this is not a limitation of the present embodiments. In another embodiments, the grinding operation may first be performed upon the bulk substrate of the top first wafer 61', and the plasma etching operation may be performed upon the stacked second wafer 62 and the first wafers 61' following the grinding operation to separate individual memory stack.

Figure 7:
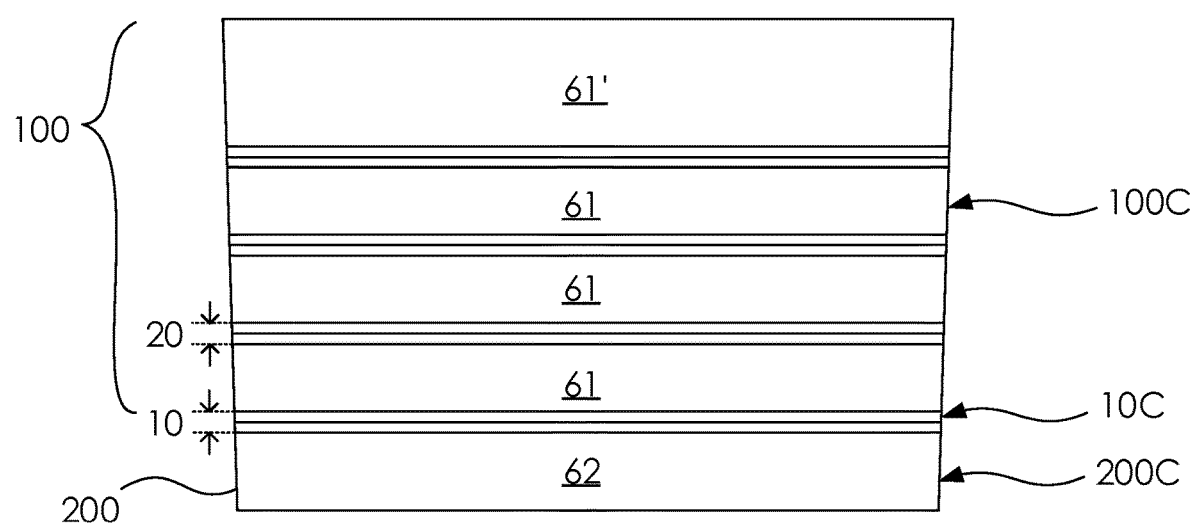
FIG. 7 illustrates a cross-sectional view of a semiconductor structure according to some embodiments of the present disclosure.

By applying the singulating operations as above mentioned, the first wafers 61, the second wafer 62, the first hybrid bonding structure 10 between the first and second wafers, and the second hybrid bonding structures 20 between adjacent first wafers 61 may be completely separated, and thereby a plurality of semiconductor structures may be obtained. In some embodiments, as shown in FIG. 7, the memory structure 100 has a first lateral surface 100C, the first hybrid bonding structure 10 has a second lateral surface 10C, and the control circuit structure 200 has a third lateral surface 200C, and the first lateral surface 100C, the second lateral surface 10C, and the third lateral surface 200C substantially have a continuous line from a cross sectional perspective. Moreover, due to the singulating operation, the continuous line may include a slope to due to the fact that the cutted edge created by laser scribing or plasma etching may not be perfectly vertical, rather, in most cases, a tapered trench may be formed. After the completion of the dicing, the tapered trench turns out to be the slope observable at the lateral surfaces of the memory structure 100, the first hybrid bonding structure 10, and the control circuit structure 200.

Figure 8:
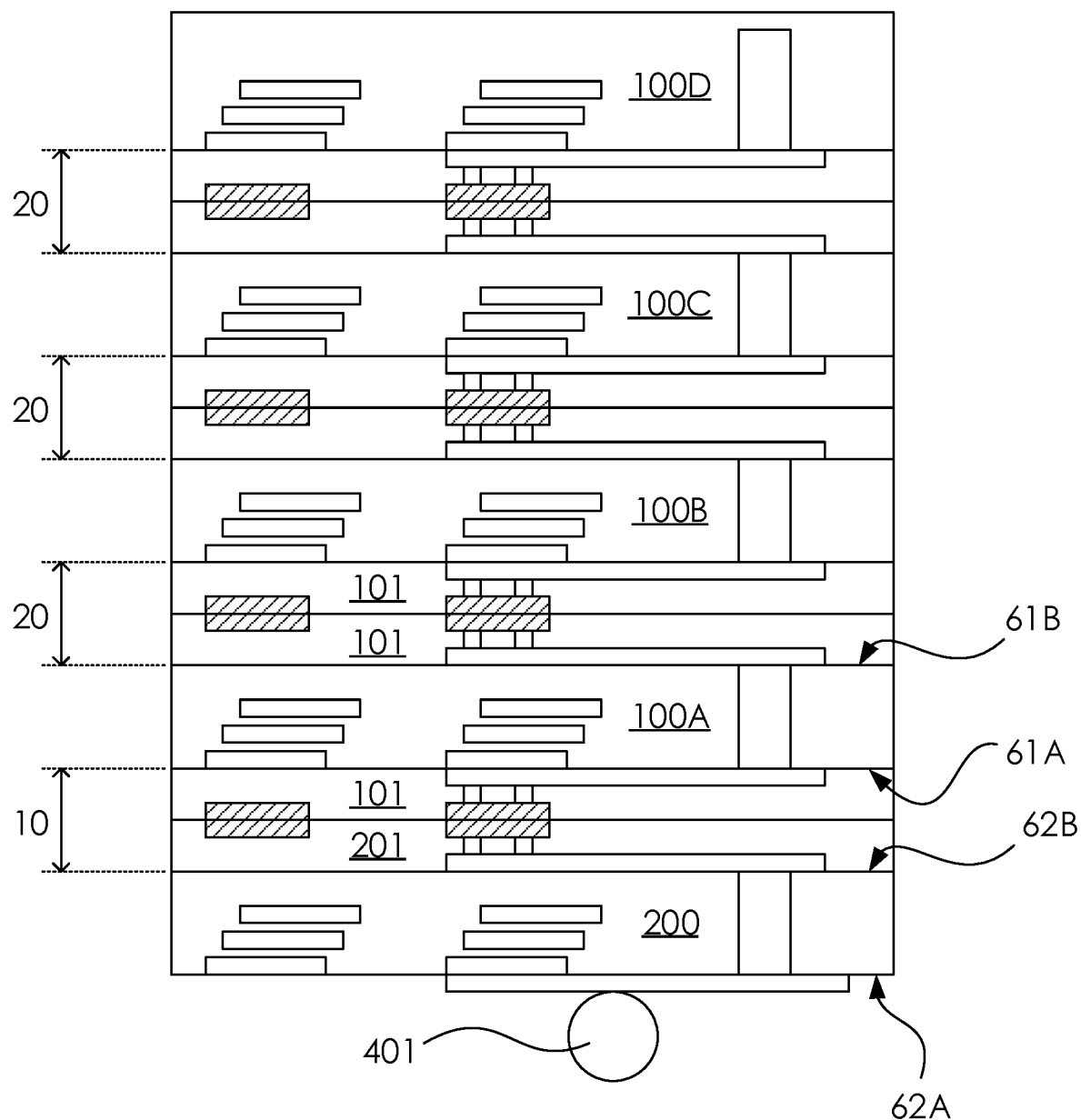
FIG. 8 illustrates a cross-sectional view of a semiconductor structure according to some embodiments of the present disclosure.

As shown in FIG. 8, in such embodiments, the logic die (i.e., the control circuit structure 200) and the memory dies 100A, 100B, 100C, and 100D may be all stacked in a face-to-back arrangement (Scheme II). In such embodiments, the reserved region for the TSV in the logic die is substantially identical to the reserved region for the TSV in memory dies, and the TSVs 104, 204 are located at the same side of a particular pair of bond pad, as previously discussed.

Moreover, in the embodiments having the stacking arrangement as Scheme II, the second surface 201A previously shown in FIG. 1 is closer to the FEOL structure of the control circuit structure 200 and further from the BEOL structure of the control circuit structure 200.

Figure 9A:
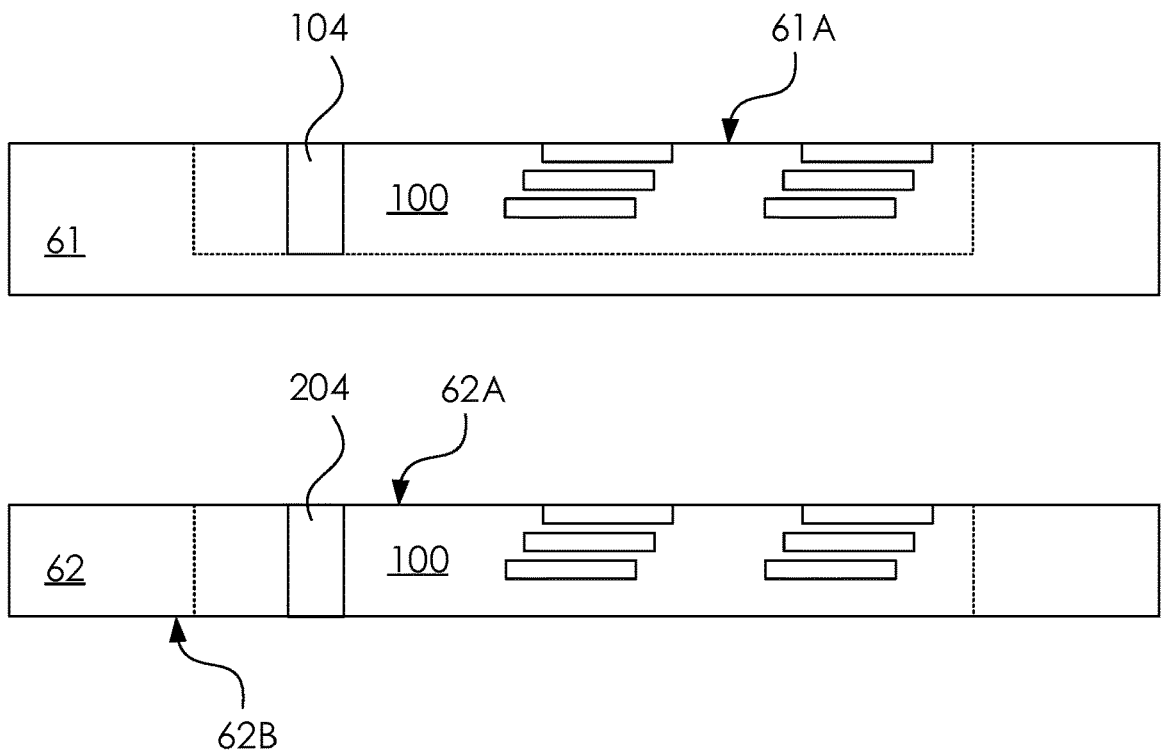
FIGS. 9A to 9B illustrate cross-sectional views of forming a semiconductor structure according to some embodiments of the present disclosure.
Figure 9B:
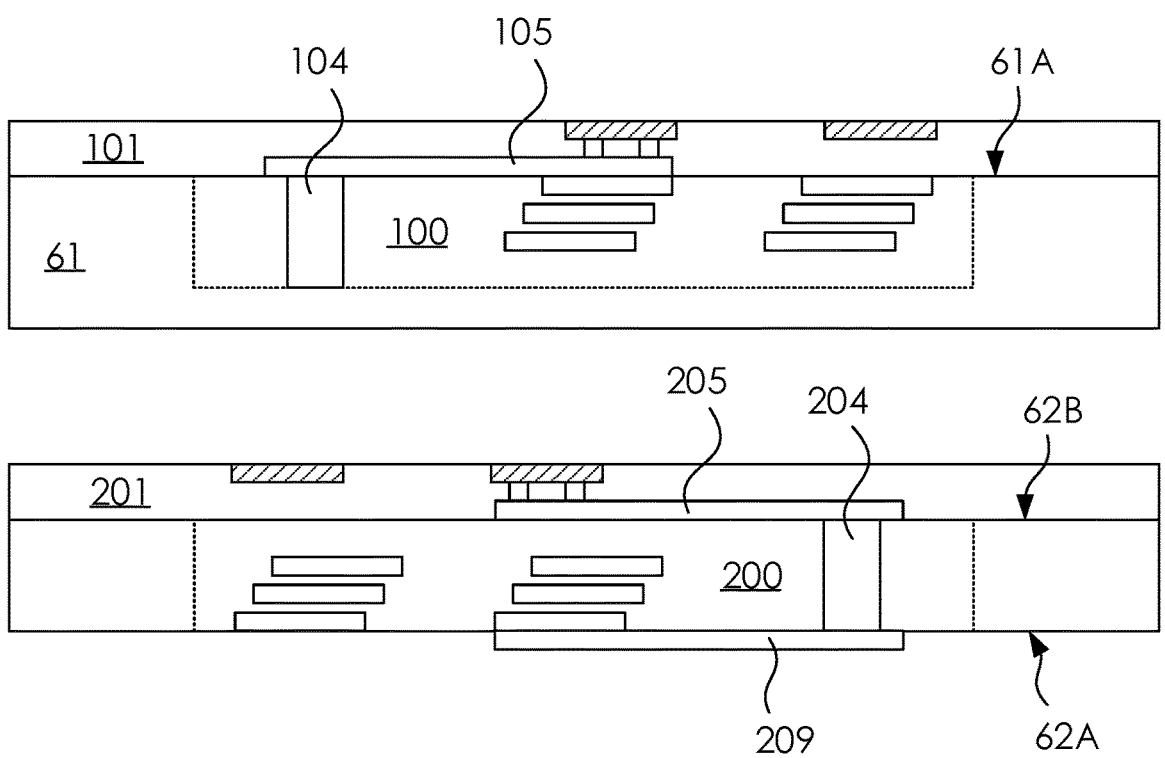

FIGS. 9A and 9B illustrates the manufacturing operations in preparation of the semiconductor structure of FIG. 8. As shown in FIGS. 9A and 9B, the second wafer 62 may be thinned to expose the second TSV 204 form the second back side 62B prior to forming the second hybrid bonding layer 201 thereon. A bottom metal layer 209 may be formed on the second face side 62A to electrically connect to the exposed second TSV 204 afterwards. Furthermore, in such embodiments, the second wafer 62 is flipped to form the second hybrid bonding layer 201 at the second back side 62B of the second wafer 62, and the second hybrid bonding layer 201 may subsequently hybrid bonded to the first hybrid bonding layer 101 on the first face side 61A of the first wafer 61. The hybrid bonding operation referred herein is similar to the hybrid bonding operation previously discussed and shown in FIG. 4E. Further operations regarding the stacking of additional number of the wafer similar to the first wafers 61 by hybrid bonding, the forming of the second conductive bump connection 401, and the operations of wafer dicing may refer to FIGS. 4F to 4J and are omitted here for brevity.

Figure 10:
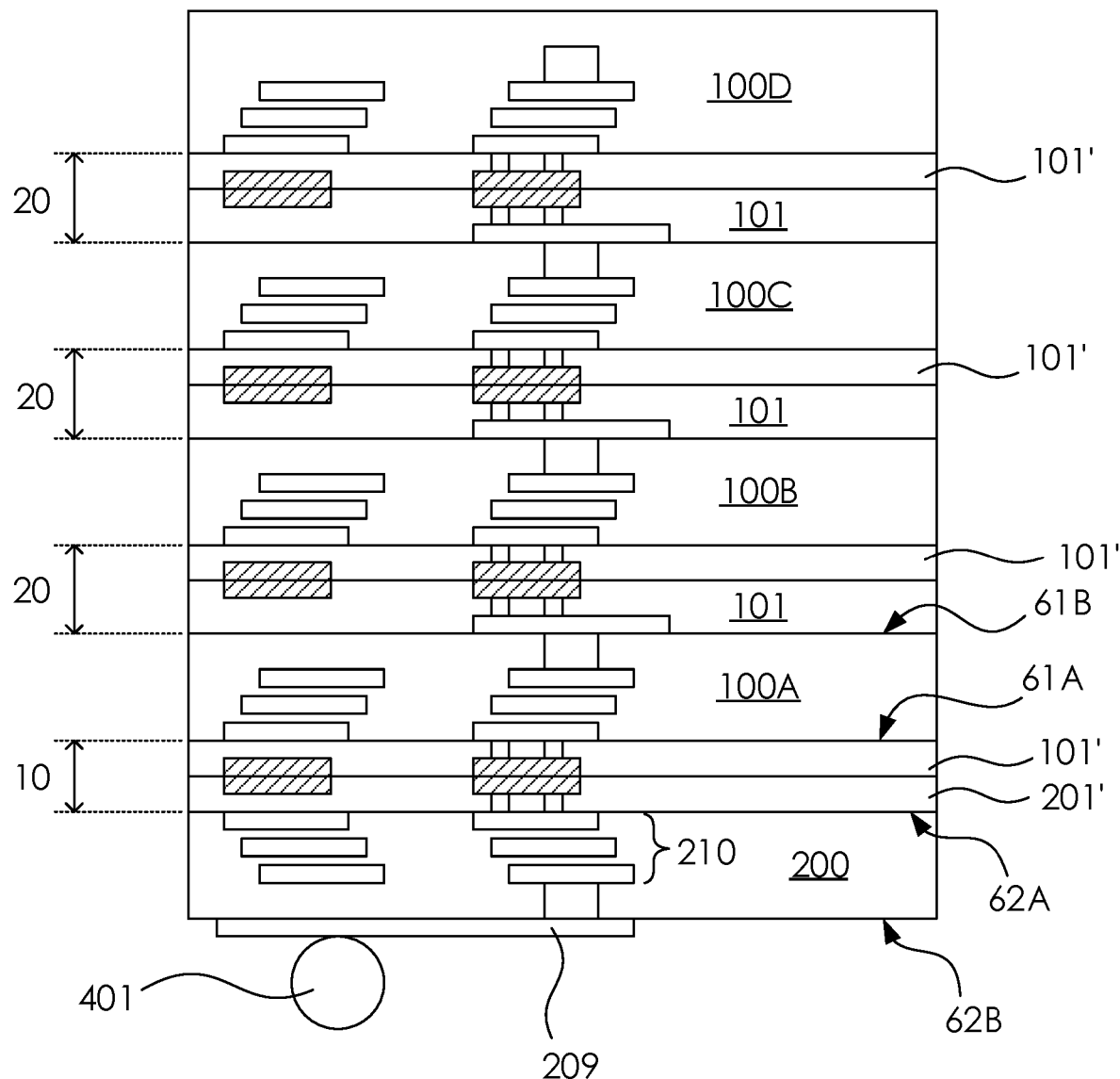
FIG. 10 illustrates a cross-sectional view of a semiconductor structure according to some embodiments of the present disclosure.

As shown in FIG. 10, in some embodiments, each of the memory structures and the control circuit structure are manufactured through a via-middle process (or in some embodiments called a via-first process). Through the via-middle process, the forming of the TSV is performed after the transistor formation and before the BEOL operations, that is, the via etching and the via filling operations are implemented after the FEOL structure is formed, but prior to the forming metallization during the BEOL stage.

Figure 11A:
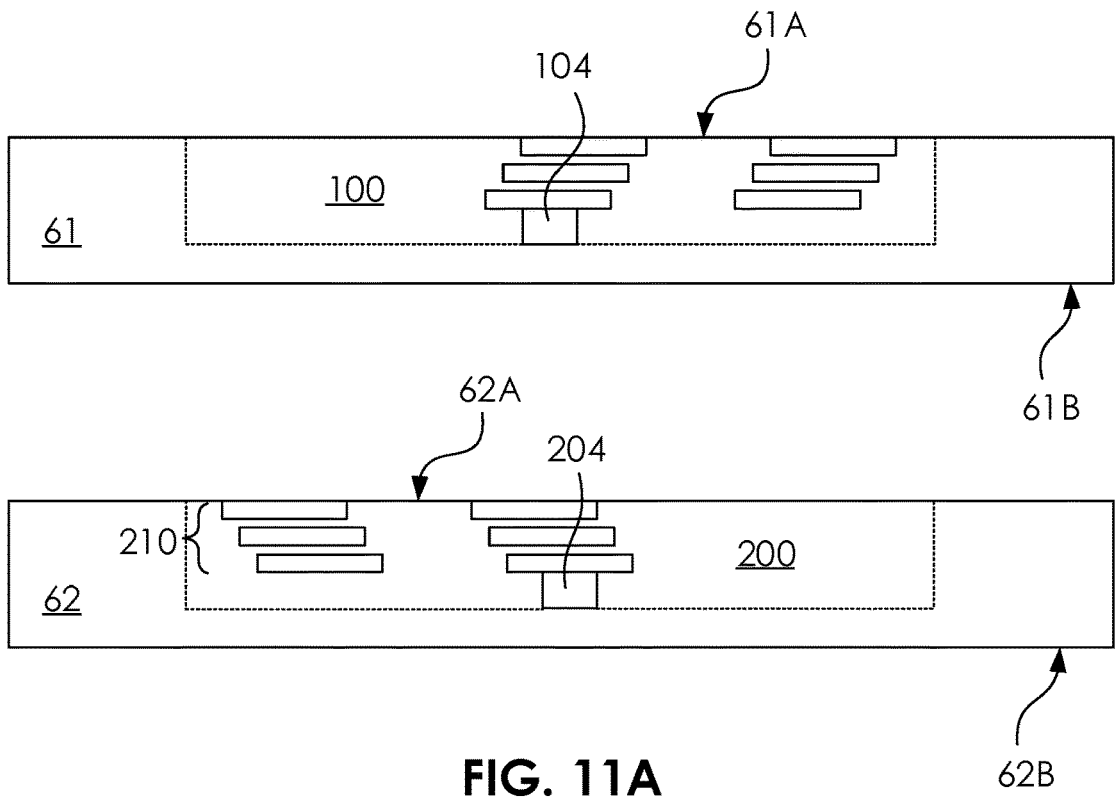
FIGS. 11A to 11B illustrate cross-sectional views of forming a semiconductor structure according to some embodiments of the present disclosure.
Figure 11B:
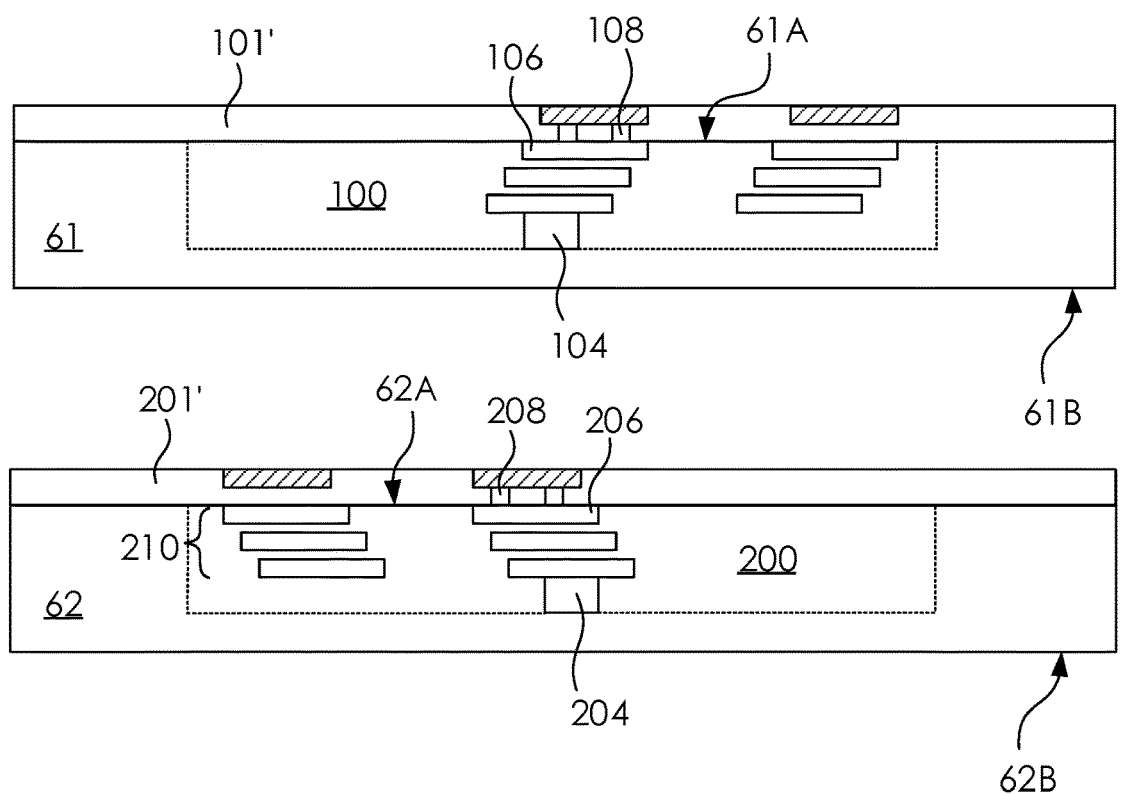

In such embodiments, the arrangement of the logic die and the memory dies in the hybrid bonding structure may be performed as the Scheme I and Scheme II as aforementioned as well. To be more detailed, as shown in FIG. 10, the logic die (i.e., the control circuit structure 200) and the memory die 100A are stacked in a face-to-face arrangement, whereas the memory dies 100A, 100B, 100C, and 100D in the memory structure are stacked in a face-to-back arrangement (Scheme I). Because the TSV 204 in the control circuit structure 200 is formed through a via-middle process or a via-first process, it is already electrically connected to a bottom of a metallization structure 210 in the control circuit structure 200. In the case of the control circuit structure 200 being stacked on the memory die 100A in a face-to-face arrangement, the second hybrid bonding layer 201' formed on the second face side 62A of the second wafer may omit the formation of the second metal layer 205 (previously shown in FIG. 3). Instead, as shown in FIGS. 11A and 11B, the conductive vias 208 may be formed proximal to the second face side 62A of the second wafer and in contact with the top metal 206 of the metallization structure 210. Likewise, the first hybrid bonding layer 101' formed on the first face side 61A of the first wafer may omit the formation of the first metal layer 105 (previously shown in FIG. 3). Instead, the conductive vias 108 may be formed proximal to the second face side 61A of the first wafer and in contact with the top metal 106 of the metallization structure.

As shown in FIG. 10, in contrast to the first hybrid bonding layer 101' and the second hybrid bonding layer 201' formed on the face sides of the wafers, the first hybrid bonding layer 101 and the second hybrid bonding layer 201 formed on the first back side 61B of the first wafer and the second back side 62B of the second wafer still may have the first metal layer 105 and the second metal layer 205 routing the TSVs to the corresponding bond pads. Further operations regarding the stack of additional number of the wafer similar to the first wafers by hybrid bonding, the forming of the second conductive bump connection 401, and the operations of wafer dicing may refer to FIGS. 4F to 4J and are omitted here for brevity.

Figure 12:
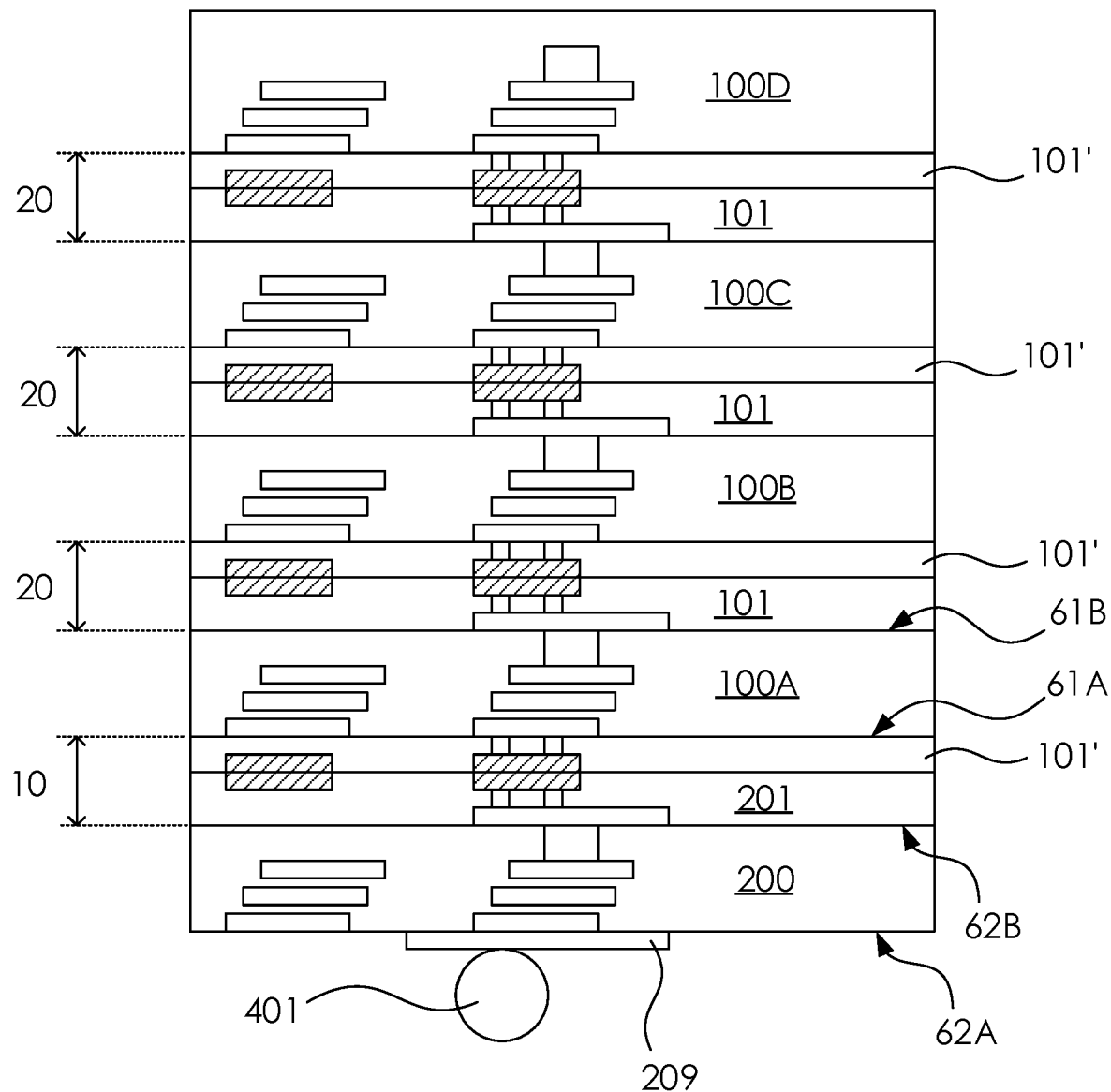
FIG. 12 illustrates a cross-sectional view of a semiconductor structure according to some embodiments of the present disclosure.
Figure 13A:
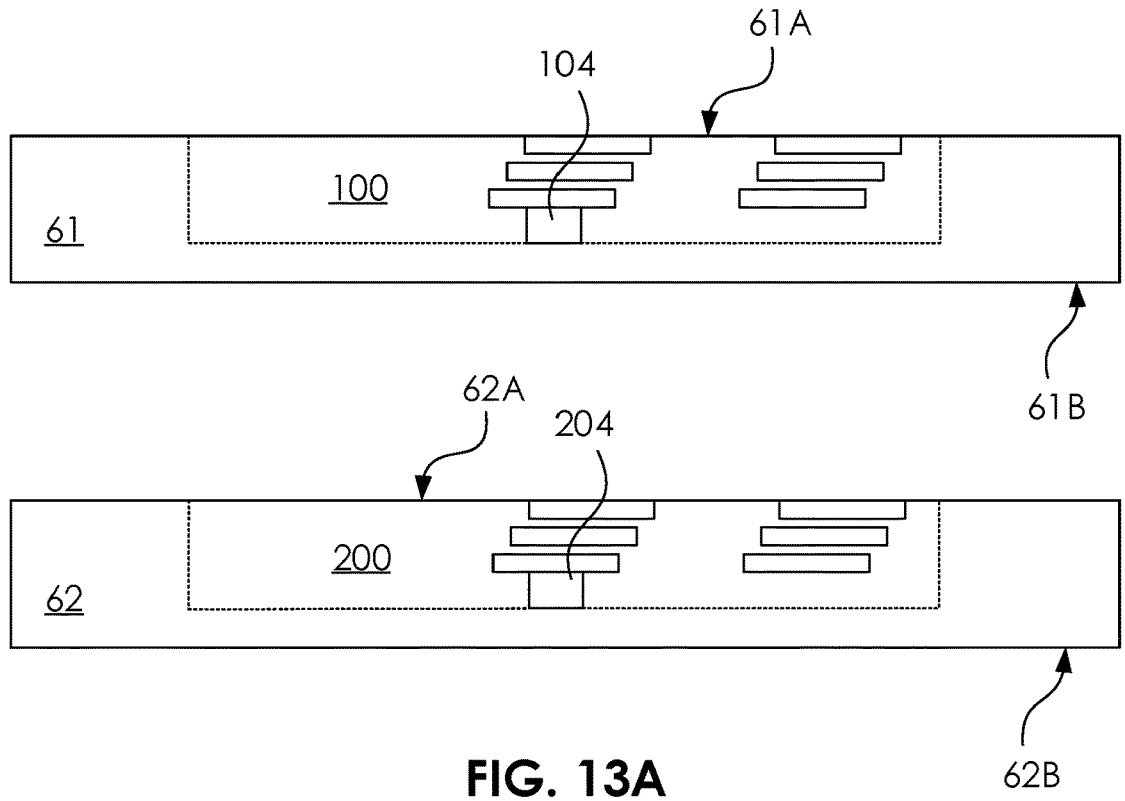
FIGS. 13A to 13B illustrate cross-sectional views of forming a semiconductor structure according to some embodiments of the present disclosure.
Figure 13B:
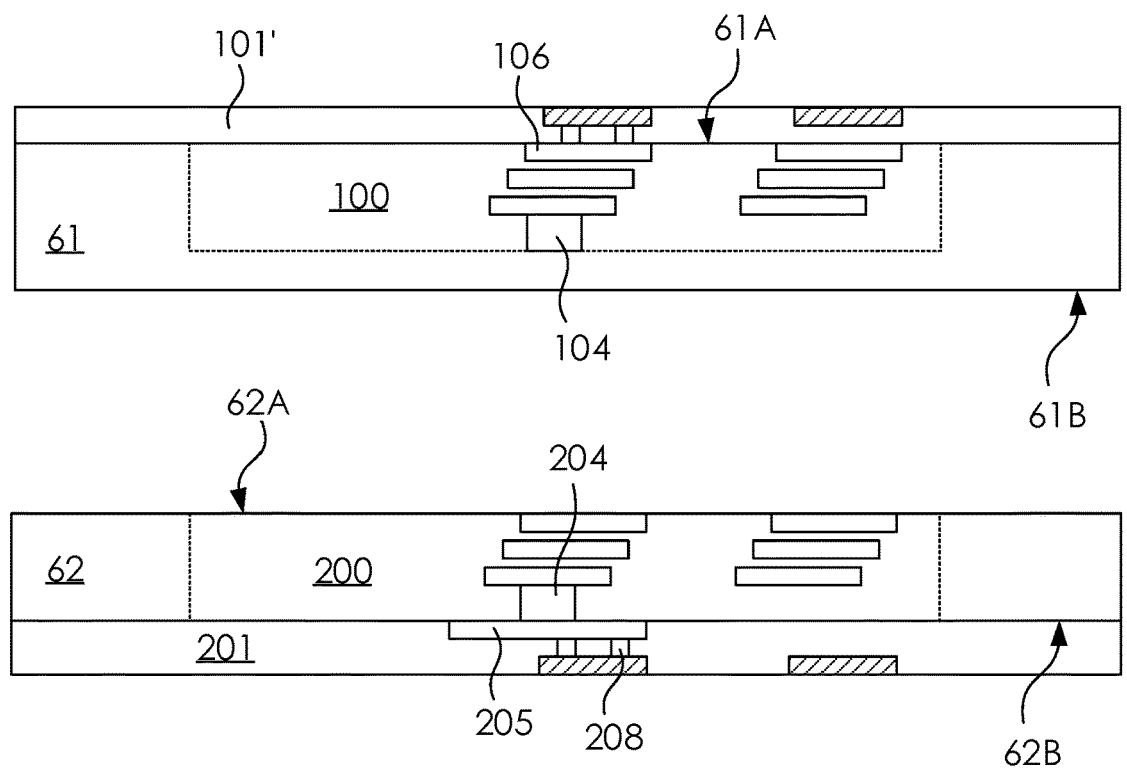

As shown in FIG. 12, in some embodiments, the logic die (i.e., the control circuit structure 200) and the memory dies 100A, 100B, 100C, and 100D in the memory structure are all manufactured through a via-middle process or a via-first process and stacked in a face-to-back arrangement (Scheme II). In such embodiments, due to the face-to-back arrangement, as shown in FIGS. 13A and 13B, the second hybrid bonding layer 201 may be formed on the second back side 62B of the second wafer 62 including the second metal layer 205, for hybrid bonded to the first hybrid bonding layer 101' without the first metal layer 105 formed on the first face side 61A of the first wafer 61. Further operations regarding the stack of more of the first wafers by hybrid bonding, the forming of the second conductive bump connection 401 and the bottom metal layer 209, and the operations of wafer dicing may refer to FIGS. 4F to 4J and are omitted here for brevity.

Figure 14:
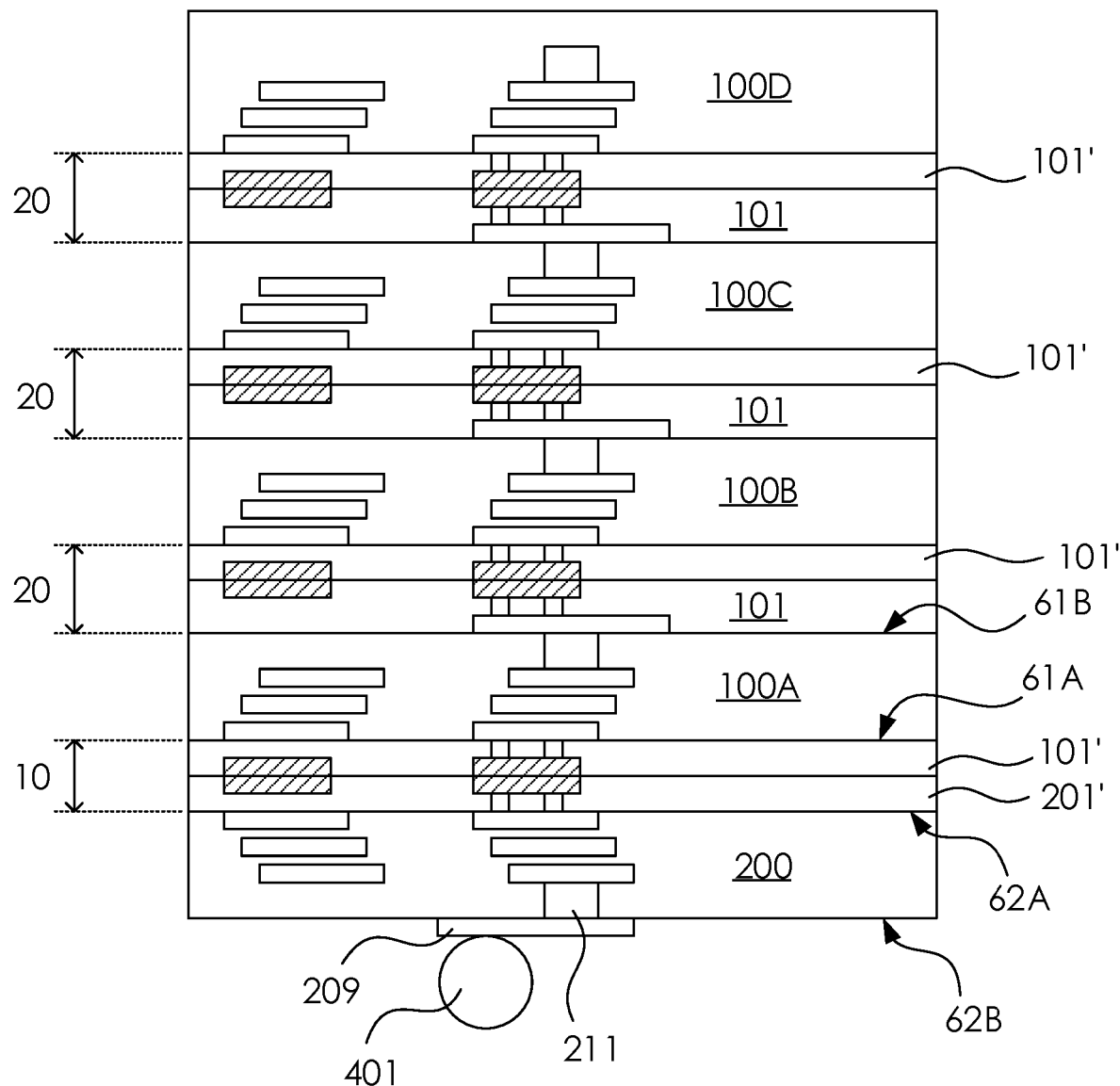
FIG. 14 illustrates a cross-sectional view of a semiconductor structure according to some embodiments of the present disclosure.
Figure 15A:
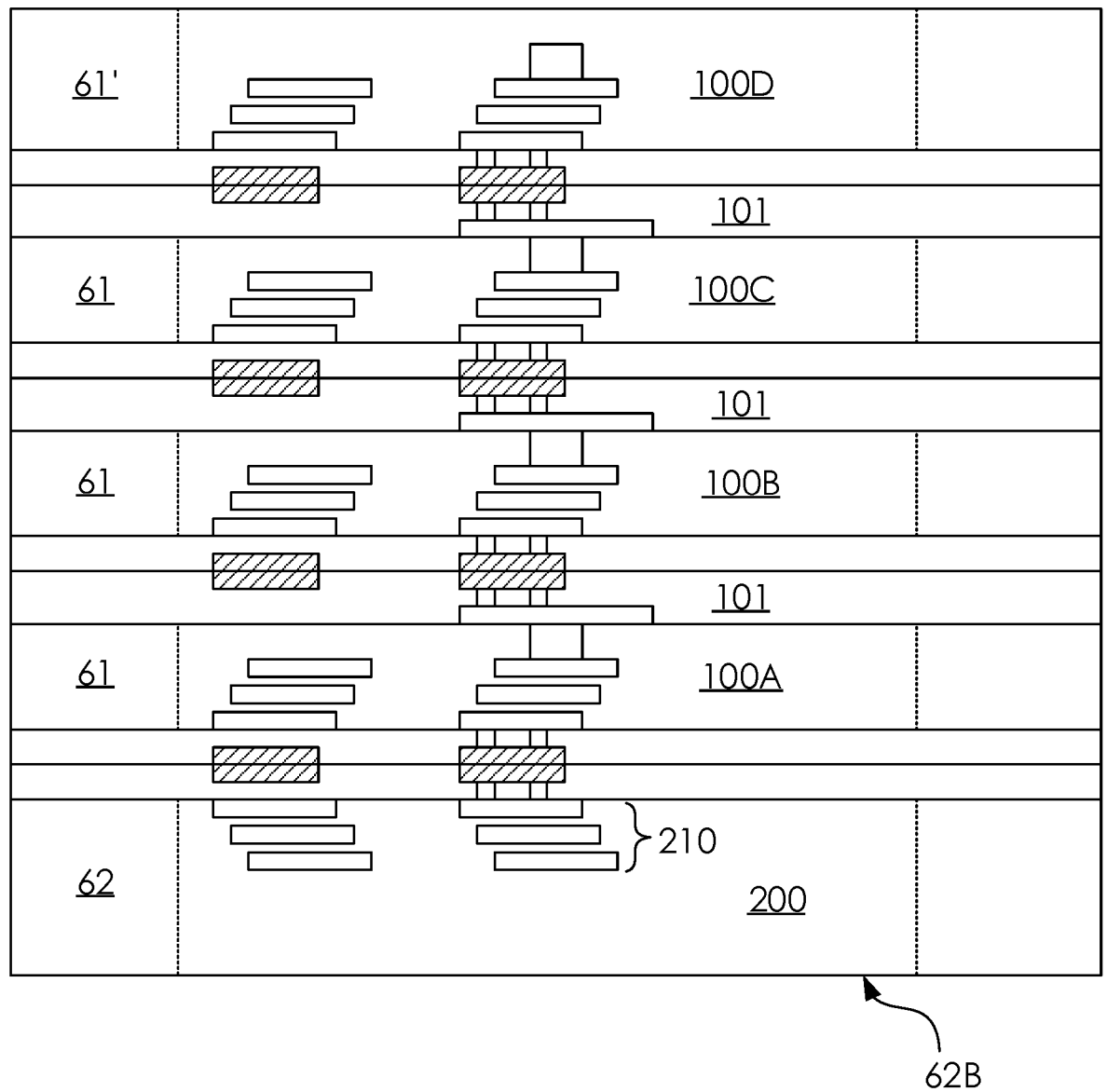
FIGS. 15A to 15C illustrate cross-sectional views of forming a semiconductor structure according to some embodiments of the present disclosure.
Figure 15B:
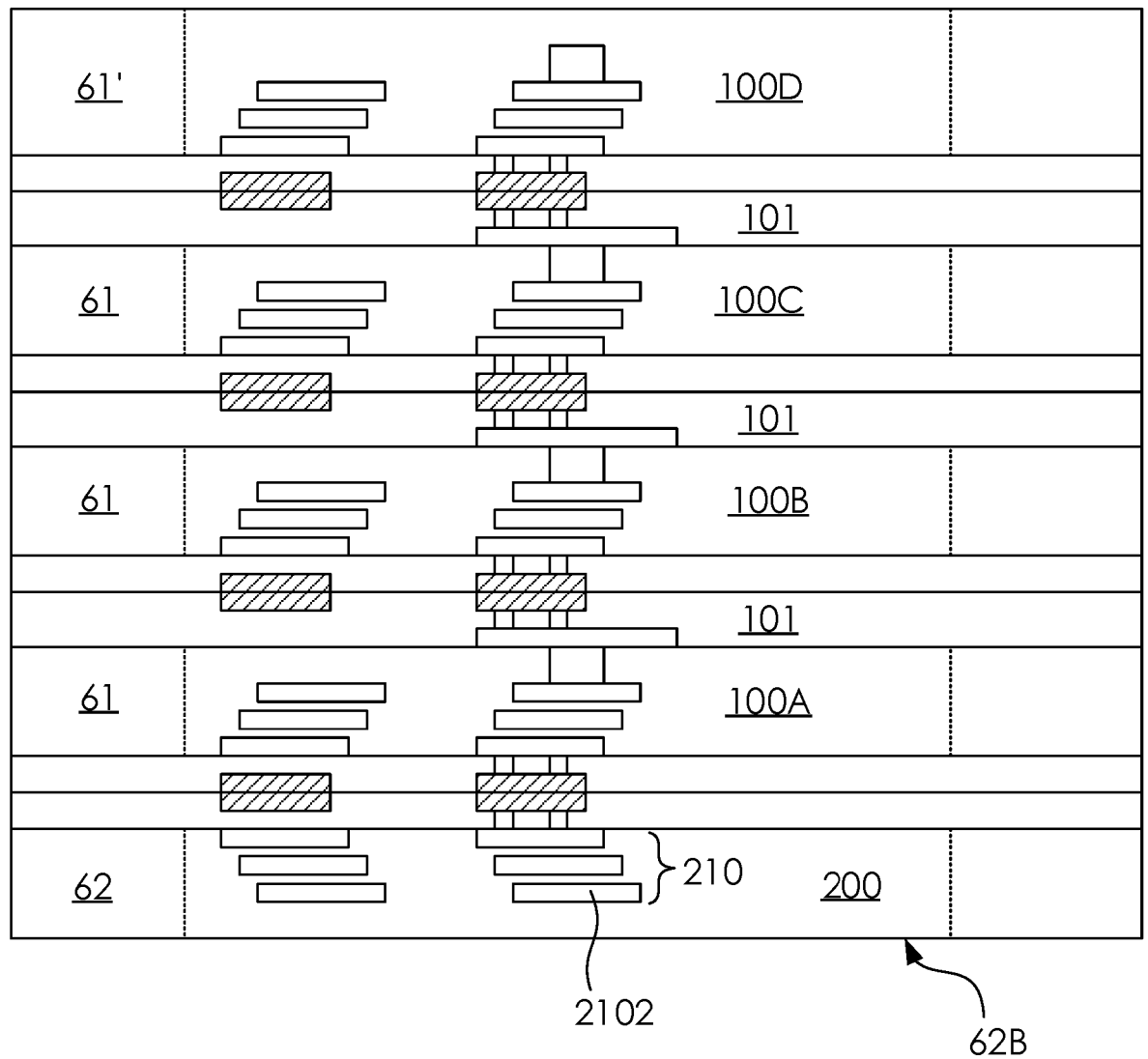
Figure 15C:
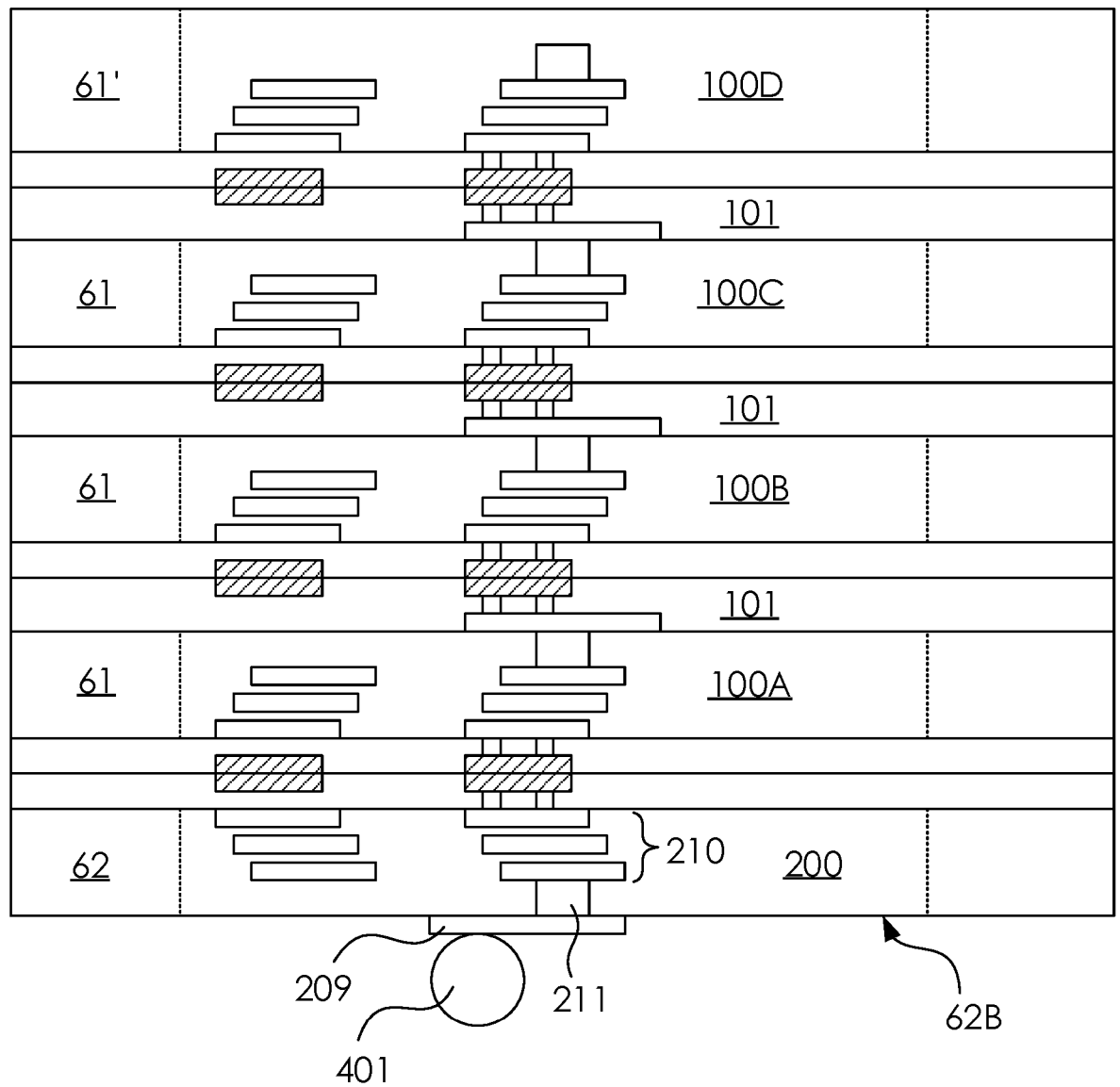

In some embodiments, the TSV structure in the logic die may be formed by a back side TSV process. That is, as shown in FIG. 14, a back side TSV (BTSV) 211 in the control circuit structure 200 is formed after the control circuit structure 200 and the memory die 100A are stacked in a face-to-face arrangement, whereas the memory dies 100A, 100B, 100C, and 100D in the memory structure are stacked in a face-to-back arrangement (Scheme I). Referring to the structure changes in FIGS. 15A, 15B, and 15C, in some embodiments, after the control circuit structure 200 and the memory dies 100A, 100B, 100C, and 100D are stacked by hybrid bonding operations (FIG. 15A). The second wafer 62 is then thinned from the second back side 62B (FIG. 15B). In some embodiments, the second wafer 62 is thinned such that a thickness between the first (e.g. the bottom) metal layer 2102 in the BEOL structure of the second wafer 62 and the second back side 62B of the second wafer 62 is less than about 10 μm. Subsequently, a via etching and a via filling operations are implemented at the second back side 62B of the second wafer 62 to form a BTSV 211 electrically connected to the metallization structure 210. Further operations regarding the details of stacking the first wafers by hybrid bonding operations, the forming of the second conductive bump connection 401 and the bottom metal layer 209, and the operations of wafer dicing may refer to FIGS. 4F to 4J and are omitted here for brevity.

As shown in FIGS. 10, 12, and 14, in some embodiments, the second TSV 204 is substantially a half-through via which contact to the BEOL structure at one end.

Briefly, according to the above mentioned embodiments, the production efficiency in forming the memory stack may be enhanced tremendously, and the risk of stacking defects caused by the micro bumping operations can be greatly reduced. Moreover, in comparison to the existing arts, by using the large number of bond pads in connecting the memory structure and the control circuit structure and the large number of bond pads in connecting two memory structures, the bandwidth of memory access of the present memory system may also be increased.

In one exemplary aspect, a semiconductor structure is provided. The semiconductor structure includes a first hybrid bonding structure, a memory structure, and a control circuit structure. The first hybrid bonding layer includes a first surface and a second surface. The memory structure is in contact with the first surface. The control circuit structure is configured to control the memory structure. The control circuit structure is in contact with the second surface.

In another exemplary aspect, a system in package (SiP) structure is provided. The SiP structure includes a first semiconductor structure, a second semiconductor structure and a substrate. The first semiconductor structure has a first critical dimension. The second semiconductor structure is stacked with the first semiconductor structure. The second semiconductor structure has a second critical dimension and in contact with the first semiconductor structure through a hybrid bonding interface. The substrate is electrically connected to the first semiconductor structure and the second semiconductor structure through a first conductive bump connection. The first critical dimension is different from the second critical dimension.

In yet another exemplary aspect, a method for manufacturing a plurality of semiconductor structures is provided. The method includes the operations as follows. A first hybrid bonding layer is formed over a first wafer including a plurality of first memory structures. A second hybrid bonding layer is formed over a second wafer including a plurality of control circuit structures. The first wafer and the second wafer are bonded through a first hybrid bonding operation to connect the first hybrid bonding layer and the second hybrid bonding layer, thereby obtaining a first bonded wafer. At least the first wafer, the second wafer, the first hybrid bonding structure, and the second hybrid bonding structure are singulated to obtain the plurality of semiconductor structures.

The foregoing outlines structures of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a plurality of semiconductor structures, the method comprising:
   forming a first hybrid bonding layer over a first wafer having a plurality of first memory structures, wherein the plurality of first memory structures are in contact with the first hybrid bonding layer;
   forming a second hybrid bonding layer over a second wafer having a plurality of control circuit structures, wherein the plurality of control circuit structures are in contact with the second hybrid bonding layer;
   bonding the first wafer and the second wafer through a first hybrid bonding operation to connect the first hybrid bonding layer and the second hybrid bonding layer, thereby obtaining a first bonded wafer; and
   singulating at least the first wafer, the second wafer, the first hybrid bonding layer, and the second hybrid bonding layer to obtain the plurality of semiconductor structures.

2. The method of claim 1, further comprising:
   forming a third hybrid bonding layer over a third wafer having a plurality of second memory structures;
   forming a fourth hybrid bonding layer over the first bonded wafer;
   bonding the third wafer and the first bonded wafer through a second hybrid bonding operation to connect the third hybrid bonding layer and the fourth hybrid bonding layer, thereby obtaining a second bonded wafer.

3. The method of claim 1, further comprising:
   forming a first via adjacent to a face side of the first wafer prior to forming the first hybrid bonding layer over the first wafer, wherein the first hybrid bonding layer is formed at the face side of the first wafer;
   forming a second via adjacent to a face side of the second wafer prior to forming the second hybrid bonding layer over the second wafer, wherein the second hybrid bonding layer is formed at the face side of the second wafer;
   thinning the first wafer from a back side of the first wafer to expose the first via after bonding the first wafer and the second wafer and prior to forming the fourth bonding layer over the first bonded wafer;
   forming a third via adjacent to a face side of the third wafer prior to forming the third hybrid bonding layer over the third wafer; and
   thinning the second wafer from a back side of the second wafer to expose the second via.

4. The method of claim 1, further comprising:
   forming a first via adjacent to a face side of the first wafer prior to forming the first hybrid bonding layer over the first wafer, wherein the first hybrid bonding layer is at the face side of the first wafer;
   forming a second via adjacent to a face side of the third wafer prior to forming the third hybrid bonding layer over the third wafer;
   thinning the first wafer from a back side of the first wafer to expose the first via after bonding the first wafer and the second wafer and prior to bonding the third wafer and the first bonded wafer;
   thinning the first bonded wafer from a back side of the second wafer to form a thinned second wafer after bonding the third wafer and the first bonded wafer; and
   forming a third through via in the thinned second wafer.

5. The method of claim 1, further comprising:
   forming a first via adjacent to a face side of the first wafer prior to forming the first hybrid bonding layer over the first wafer, wherein the first hybrid bonding layer is at a face side of the first wafer;
   forming a second via adjacent to a face side of the second wafer;
   thinning the second wafer from a back side of the second wafer to expose the second via prior to forming the second hybrid bonding layer over the second wafer, wherein the second hybrid bonding layer is formed at the back side of the second wafer; and
   forming a third via adjacent to a face side of the third wafer prior to forming the third hybrid bonding layer over the third wafer.

6. The method of claim 1, wherein singulating at least the first wafer and the second wafer comprises:
   performing a laser scribing operation; and
   performing a mechanical dicing operation following the laser scribing operation.

7. The method of claim 1, wherein singulating at least the first wafer and the second wafer comprises:
   performing a plasma etching operation; and
   performing a grinding operation.

8. The method of claim 1, further comprising:
forming a fourth hybrid bonding layer over the first bonded wafer; and
bonding the first bonded wafer and at least one third wafer having a third hybrid bonding layer and a second memory structure, wherein the second memory structure is in contact with the third hybrid bonding layer.

9. The method of claim 8, wherein the third wafer is in proximity to the first wafer of the first bonded wafer.

10. The method of claim 8, wherein the first wafer and the third wafer are bonded over the second wafer, and the method further comprising:
thinning the third wafer to obtain a thinned third wafer exposing a TSV prior to bonding another third wafer over the thinned third wafer.

11. The method of claim 8, wherein the first wafer and third wafer are bonded over the second wafer, and the third wafer comprises a half-through via electrically connected to a metallization structure of the third wafer.

12. The method of claim 8, further comprising:
thinning the second wafer to have a thickness less than about 10 μm to obtain a thinned second wafer; and
forming a half-through via in the thinned second wafer.

13. A method for manufacturing a system in package (SiP), the method comprising:
forming a first hybrid bonding layer over a first wafer, the first wafer comprises a first semiconductor structure associated with a memory having a first critical dimension;
forming a second hybrid bonding layer over a second wafer, the second wafer comprises a second semiconductor structure associated with a control circuit having a second critical dimension;
stacking the first wafer and the second wafer through a first hybrid bonding operation, thereby obtaining a first bonded wafer; and
disposing the first bonded wafer on an interposer.

14. The method of claim 13, further comprising:
singulating the first wafer and the second wafer to obtain a plurality of semiconductor structures prior to disposing the first bonded wafer on the interposer.

15. The method of claim 13, further comprising:
thinning the second wafer from a back side of the second wafer to obtain a thinned second wafer exposing a TSV; and
disposing a bottom metal layer and a conductive bump connection on the thinned second wafer to electrically connect to the TSV.

16. The method of claim 15, wherein the SiP comprises a third semiconductor structure electrically connected to the first semiconductor structure and the second semiconductor structure through the conductive bump connection, wherein the third semiconductor structure has a third critical dimension smaller than the first critical dimension.

17. The method of claim 13, wherein the first critical dimension is smaller than or substantially equal to the second critical dimension.

18. The method of claim 13, further comprising:
thinning the second wafer from a back side of the second wafer to expose a half-through via in the second wafer; and
disposing a bottom metal layer and a conductive bump connection on the back side of the second wafer to electrically connect to the half-through via.

19. The method of claim 13, further comprising:
thinning the second wafer from a back side of the second wafer to obtain a thinned second wafer, wherein a thickness of the thinned second wafer is less than about 10 μm;
forming a half-through via in the thinned second wafer, wherein the half-through via is electrically connected to a metallization structure of the second wafer;
disposing a bottom metal layer and a conductive bump connection on the back side of the second wafer to electrically connect to the half-through via.

* * * * *